(12) United States Patent
Kimura et al.

(10) Patent No.: US 10,964,377 B2
(45) Date of Patent: Mar. 30, 2021

(54) SEMICONDUCTOR STORAGE DEVICE

(71) Applicant: KIOXIA CORPORATION, Tokyo (JP)

(72) Inventors: Keita Kimura, Fujisawa Kanagawa (JP); Kenri Nakai, Fujisawa Kanagawa (JP); Mario Sako, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/807,078

(22) Filed: Mar. 2, 2020

(65) Prior Publication Data

US 2021/0065774 A1 Mar. 4, 2021

(30) Foreign Application Priority Data

Sep. 3, 2019 (JP) .............................. JP2019-160266

(51) Int. Cl.
| | |
|---|---|
| *G11C 11/4076* | (2006.01) |
| *G11C 11/4074* | (2006.01) |
| *G11C 11/4091* | (2006.01) |
| *G11C 7/22* | (2006.01) |
| *G11C 11/408* | (2006.01) |
| *G11C 7/10* | (2006.01) |
| *G11C 11/4094* | (2006.01) |

(52) U.S. Cl.
CPC ........ *G11C 11/4076* (2013.01); *G11C 7/1039* (2013.01); *G11C 7/22* (2013.01); *G11C 11/4074* (2013.01); *G11C 11/4085* (2013.01); *G11C 11/4087* (2013.01); *G11C 11/4091* (2013.01); *G11C 11/4094* (2013.01)

(58) Field of Classification Search
CPC .................................................. G11C 11/4076
See application file for complete search history.

(56) References Cited

U.S. PATENT DOCUMENTS

| | | | |
|---|---|---|---|
| 6,807,104 B2 | 10/2004 | Arai et al. | |
| 7,986,573 B2 | 7/2011 | Li | |
| 9,672,926 B2* | 6/2017 | Shiino | ................. G11C 11/5642 |
| 10,580,501 B2* | 3/2020 | Watanabe | .............. G11C 16/26 |

(Continued)

FOREIGN PATENT DOCUMENTS

| | | |
|---|---|---|
| JP | 2011-210337 A | 10/2011 |
| JP | 2015-176309 A | 10/2015 |
| WO | 2011066235 A1 | 6/2011 |

*Primary Examiner* — Douglas King
(74) *Attorney, Agent, or Firm* — Kim & Stewart LLP

(57) ABSTRACT

A semiconductor storage device includes first, second, and third transistors, first, second, and third bit lines connected to the first, second, and third transistors, a word line connected to the first, second, and third transistors, and a control circuit configured to perform a program operation for writing data to the second and third transistors, including raising a first voltage applied to the first bit line at a first timing, raising a second voltage applied to the word line at a second timing, raising a third voltage applied to the second bit line at a third timing, raising a fourth voltage applied to the third bit line at a fourth timing, and lowering the first voltage at a fifth timing. The first voltage is raised to a first predetermined voltage, and each of the third and fourth voltages is raised to a second predetermined voltage smaller than the first predetermined voltage.

20 Claims, 15 Drawing Sheets

(56) References Cited

U.S. PATENT DOCUMENTS

| | | | |
|---|---|---|---|
| 2010/0135078 A1* | 6/2010 | Iwai | G11C 16/3436 365/185.03 |
| 2012/0020153 A1* | 1/2012 | Joo | G11C 16/3454 365/185.03 |
| 2015/0262630 A1 | 9/2015 | Shirakawa et al. | |

* cited by examiner

SEMICONDUCTOR STORAGE DEVICE

CROSS-REFERENCE TO RELATED APPLICATION(S)

This application is based upon and claims the benefit of priority from Japanese Patent Application No. 2019-160266, filed Sep. 3, 2019, the entire contents of which are incorporated herein by reference.

FIELD

Embodiments described herein relate generally to a semiconductor storage device.

BACKGROUND

A semiconductor storage device which includes a plurality of memory strings including memory transistors is known.

DETAILED DESCRIPTION

Figure 1:
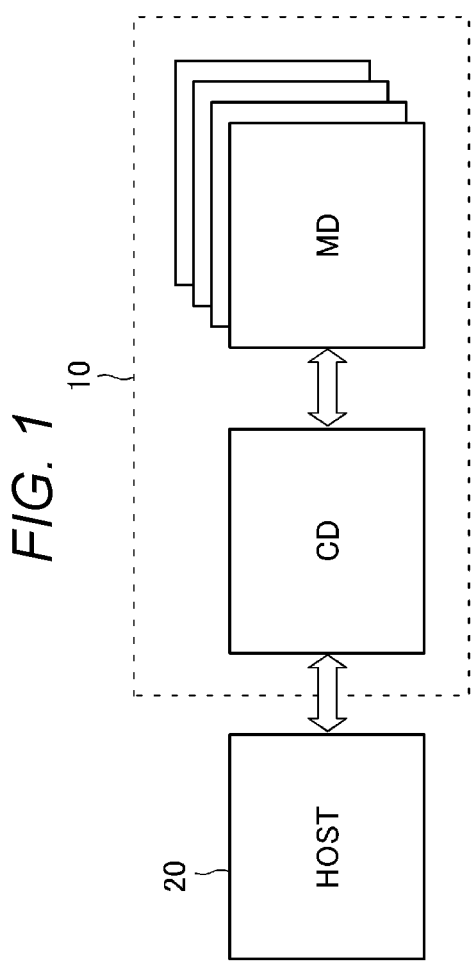
FIG. 1 is a schematic block diagram showing a configuration of a memory system according to a first embodiment.

Embodiments provide a semiconductor storage device that can be suitably controlled.

In general, according to one embodiment, a semiconductor storage device includes a plurality of memory transistors including first, second, and third memory transistors, a plurality of bit lines including first, second, and third bit lines electrically connected to the first, second, and third memory transistors, respectively, a word line electrically connected to the first, second, and third memory transistors, and a control circuit configured to perform a program operation to write data to the plurality of memory transistors. The program operation for writing data to the second and third memory transistors includes raising a first voltage applied to the first bit line at a first timing, raising a second voltage applied to the word line at a second timing after the first timing, raising a third voltage applied to the second bit line at a third timing after the second timing, raising a fourth voltage applied to the third bit line at a fourth timing after the third timing, and lowering the first voltage at a fifth timing after the fourth timing. The first voltage is raised to a first predetermined voltage, and each of the third and fourth voltages is raised to a second predetermined voltage that is smaller than the first predetermined voltage.

Next, a semiconductor storage device according to an embodiment will be described in detail with reference to the drawings. The following embodiments are merely examples, and are not intended to limit the present disclosure.

In the present specification, the term "semiconductor storage device" may mean a memory die or a memory system including a memory chip, a memory card, or a control die such as an SSD (solid state drive). Furthermore, the "semiconductor storage device" may be a smart phone, a tablet terminal, or a host computer such as a personal computer.

In the present specification, when a first element is said to be "electrically connected" to a second element, the first element may be directly connected to the second element, or the first element may be connected to the second element via a wiring, a semiconductor member, or a transistor. For example, when three transistors are connected in series, a first transistor is "electrically connected" to a third transistor even when a second transistor is in an OFF state.

In the present specification, when a first element is said to be "connected between" a second element and a third element, it may mean that the first element, the second element, and the third element are connected in series, and the first element is provided in current paths of the second element and the third element.

In the present specification, when it is said that a circuit brings two wirings "into conduction", for example, it may mean that the circuit includes a transistor, and the transistor is provided in a current path between the two wirings, and the transistor is in an ON state.

[Memory System 10]

FIG. 1 is a schematic block diagram showing a configuration of a memory system 10 according to a first embodiment.

The memory system 10 reads, writes, and erases user data according to a signal transmitted from a host computer 20. The memory system 10 is a system capable of storing user data, such as a memory chip, a memory card, and an SSD. The memory system 10 includes a plurality of memory dies MDs for storing user data, and a control die CD connected to the plurality of memory dies MDs and the host computer 20. The control die CD includes, for example, a processor, a RAM (random access memory), a ROM (read only memory), and an ECC (error check correction) circuit, and performs a processing such as conversion between a logical address and a physical address, bit error detection/correction, and wear leveling.

Figure 2:
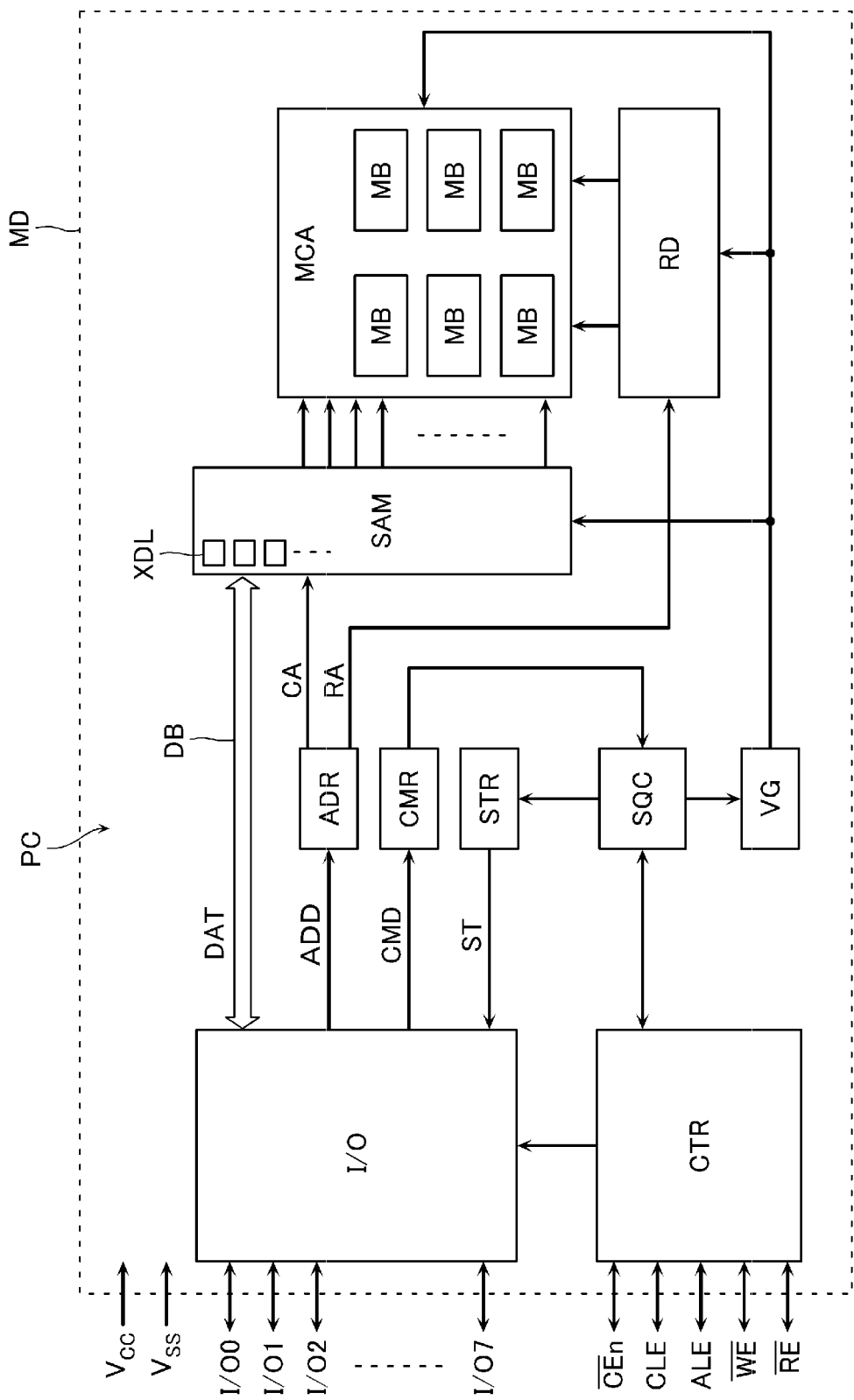
FIG. 2 is a schematic block diagram showing a configuration of a memory die according to the first embodiment.
Figure 3:
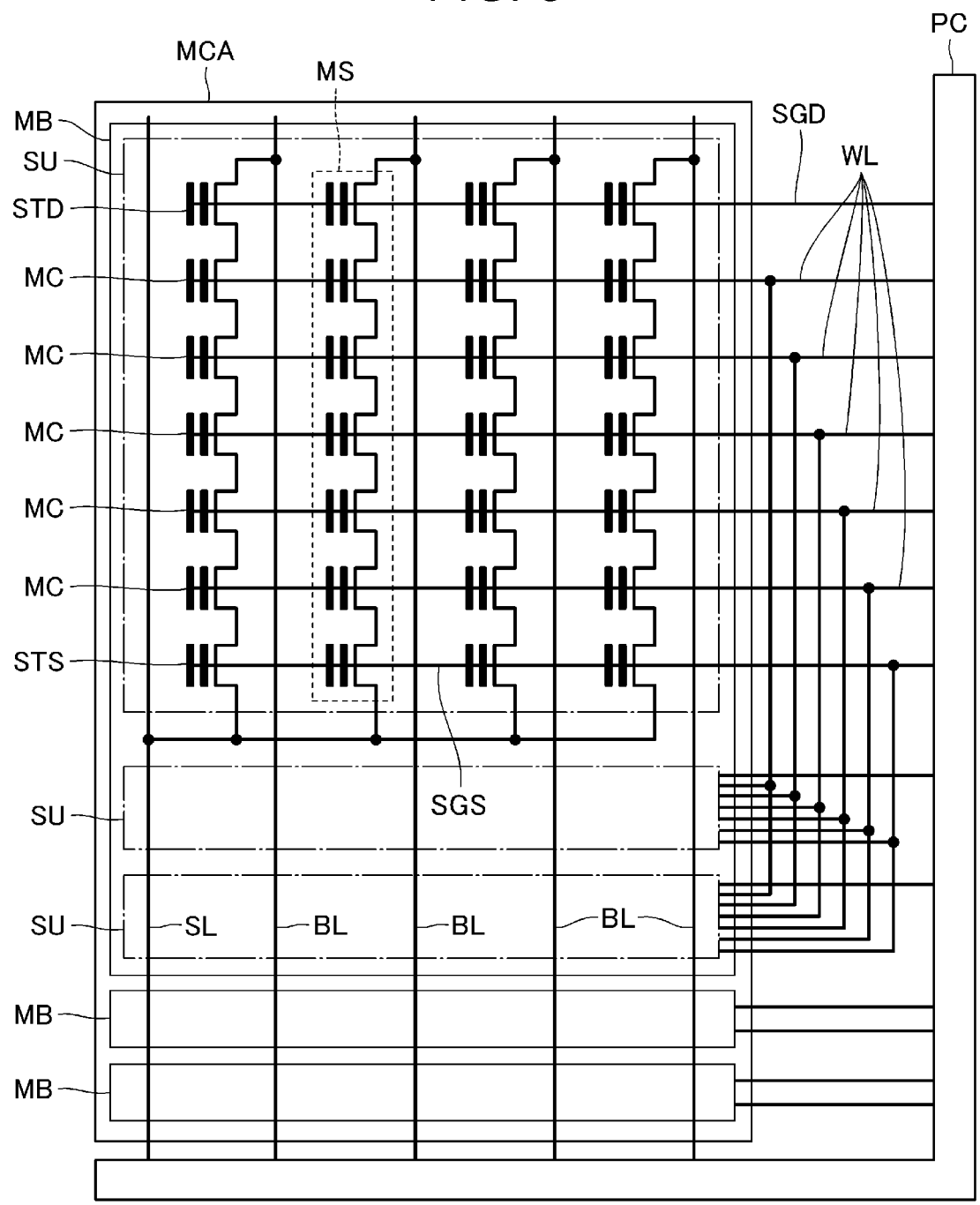
FIG. 3 is a schematic circuit diagram of a memory cell array according to the first embodiment.
Figure 4:
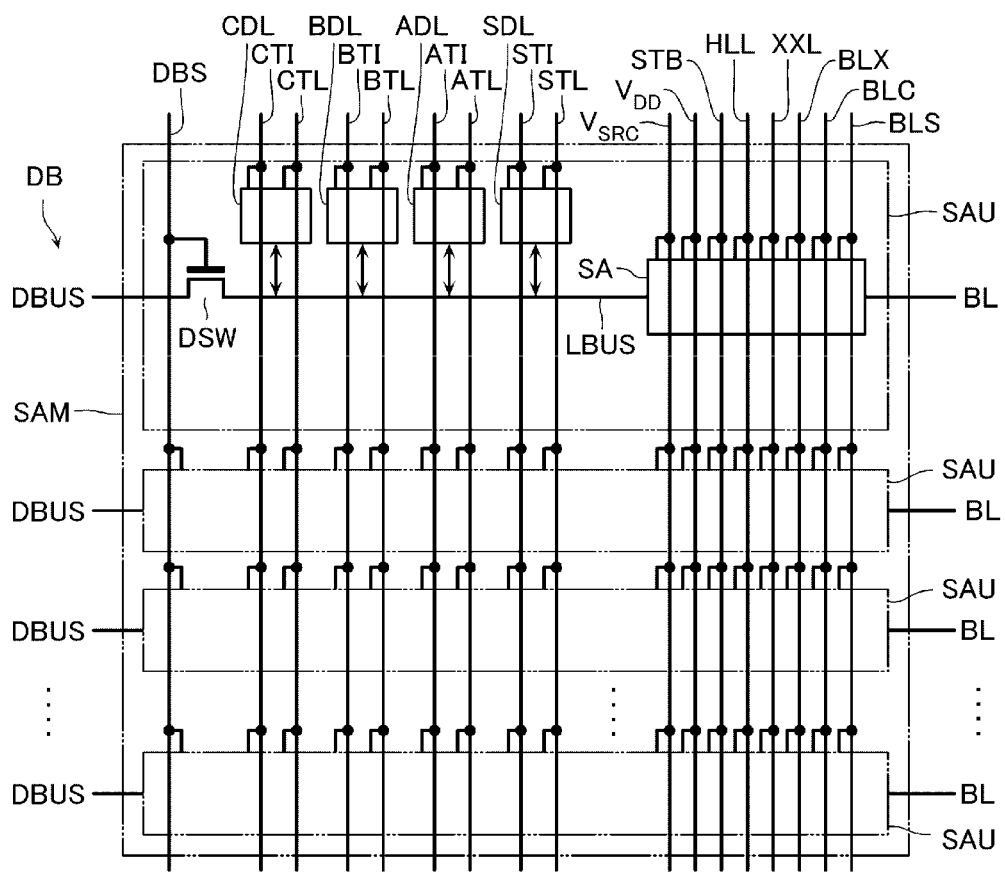
FIG. 4 is a schematic circuit diagram of a sense amplifier module according to the first embodiment.
Figure 5:
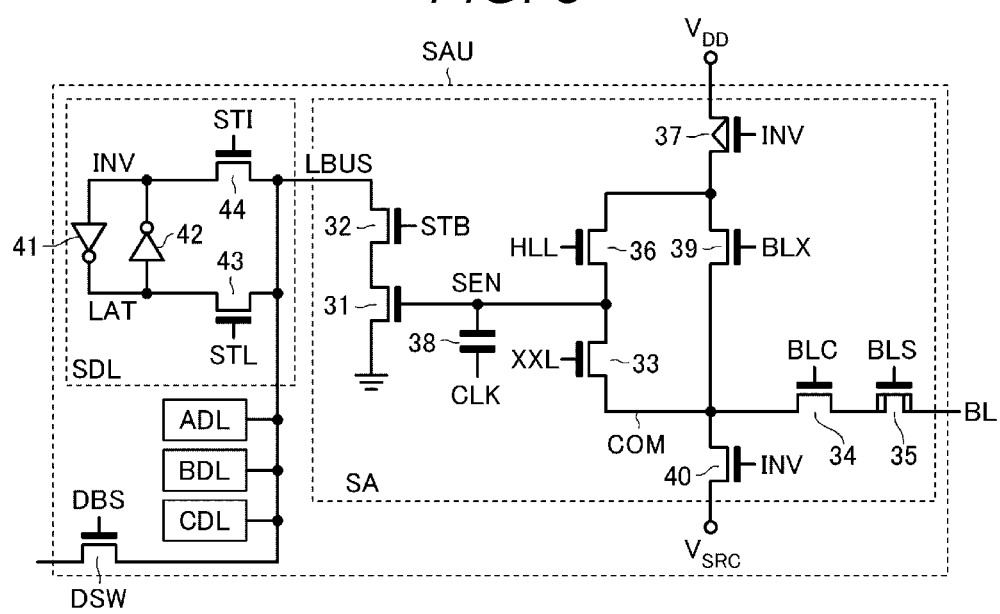
FIG. 5 is a schematic circuit diagram of a sense amplifier according to the first embodiment.

FIG. 2 is a schematic block diagram showing a configuration of the memory die MD according to the first embodiment. FIGS. 3 to 5 are partial schematic circuit diagrams of the memory die MD.

As shown in FIG. 2, the memory die MD includes a memory cell array MCA for storing data and a peripheral circuit PC connected to the memory cell array MCA.

[Memory Cell Array MCA]

The memory cell array MCA includes a plurality of memory blocks MBs. Each of the plurality of memory blocks MBs includes a plurality of string units SUs as shown in FIG. 3. Each of the plurality of string units SUs includes a plurality of memory strings MSs. One ends of the plurality of memory strings MSs are connected to the peripheral circuit PC via bit lines BL. The other ends of the plurality of memory strings MSs are connected to the peripheral circuit PC via a common source line SL.

The memory string MS includes a drain select transistor STD, a plurality of memory cells MCs, and a source select transistor STS connected in series between the bit line BL and the source line SL. Hereinafter, the drain select transistor STD and the source select transistor STS may be simply referred to as select transistors (STD, STS).

The memory cell MC according to the present embodiment is a field effect transistor (i.e., a memory transistor) including a semiconductor layer functioning as a channel region, a gate insulating film including a charge storage film, and a gate electrode. A threshold voltage of the memory cell MC changes according to an amount of charges in the charge storage film. The memory cell MC stores 1-bit or multiple-bit data. A word line WL is connected to each of gate electrodes of the plurality of memory cells MCs corresponding to one memory string MS. Each of these word lines WLs is commonly connected to all the memory strings MSs in one memory block MB.

The select transistors (STD, STS) are field effect transistors each including a semiconductor layer functioning as a channel region, a gate insulating film, and a gate electrode. Select gate lines (SGD, SGS) are connected to gate electrodes of the select transistors (STD, STS), respectively. The drain select line SGD is provided corresponding to the string unit SU, and is commonly connected to all the memory strings MSs in one string unit SU. The source select line SGS is commonly connected to all the memory strings MSs in one memory block MB.

[Peripheral Circuit PC]

As shown in FIG. 2, the peripheral circuit PC includes a row decoder RD, a sense amplifier module SAM, a voltage generation circuit VG, and a sequencer SQC. In addition, the peripheral circuit PC includes an address register ADR, a command register CMR, and a status register STR. Further, the peripheral circuit PC includes an input/output control circuit I/O and a logic circuit CTR.

The row decoder RD includes, for example, a decode circuit and a switch circuit. The decode circuit decodes a row address RA stored in the address register ADR. The switch circuit brings the word line WL and the select gate lines (SGD, SGS) corresponding to the row address RA into conduction with a corresponding voltage supply line according to an output signal of the decode circuit.

As shown in FIG. 4, the sense amplifier module SAM includes a plurality of sense amplifier units SAUs corresponding to a plurality of bit lines BLs. The sense amplifier unit SAU includes a sense amplifier SA connected to the bit line BL, a wiring LBUS connected to the sense amplifier SA, and latch circuits SDL, ADL, BDL, and CDL connected to the wiring LBUS. The wiring LBUS in each sense amplifier unit SAU is connected to a wiring DBUS via a switch transistor DSW. The sense amplifier unit SAU may include more latch circuits connected to the wiring LBUS.

As shown in FIG. 5, the sense amplifier SA includes a sense transistor 31 that discharges charges of the wiring LBUS according to a current flowing through the bit line BL. A source electrode of the sense transistor 31 is connected to a ground voltage supply terminal. A drain electrode of the sense transistor 31 is connected to the wiring LBUS via a switch transistor 32. A gate electrode of the sense transistor 31 is connected to the bit line BL via a sense node SEN, a discharge transistor 33, a node COM, a clamp transistor 34, and a breakdown voltage transistor 35. The sense node SEN is connected to a voltage supply line $V_{DD}$ via a charge transistor 36 and a charge transistor 37, and is connected to an internal control signal CLK via a capacitor 38. The node COM is connected to the voltage supply line $V_{DD}$ via a charge transistor 39 and the charge transistor 37, and is connected to a voltage supply line $V_{SRC}$ via a discharge transistor 40.

The sense transistor 31, the switch transistor 32, the discharge transistor 33, the clamp transistor 34, the charge transistor 36, the charge transistor 39, and the discharge transistor 40 are, for example, enhancement NMOS transistors. The breakdown voltage transistor 35 is, for example, a depletion NMOS transistor. The charge transistor 37 is, for example, a PMOS transistor.

A gate electrode of the switch transistor 32 is connected to a signal line STB. A gate electrode of the discharge transistor 33 is connected to a signal line XXL. A gate electrode of the clamp transistor 34 is connected to a signal line BLC. A gate electrode of the breakdown voltage transistor 35 is connected to a signal line BLS. A gate electrode of the charge transistor 36 is connected to a signal line HLL. A gate electrode of the charge transistor 37 is connected to a node INV of the latch circuit SDL. A gate electrode of the charge transistor 39 is connected to a signal line BLX. A gate electrode of the discharge transistor 40 is connected to a node INV of the latch circuit SDL. The signal lines STB, XXL, BLC, BLS, HLL, and BLX are connected to the sequencer SQC.

The latch circuit SDL includes nodes LAT and INV, inverters 41 and 42 connected in parallel to the nodes LAT and INV, a switch transistor 43 connected to the node LAT and the wiring LBUS, and a switch transistor 44 connected to the node INV and the wiring LBUS. The switch transistors 43 and 44 are, for example, NMOS transistors. A gate electrode of the switch transistor 43 is connected to the sequencer SQC via a signal line STL. A gate electrode of the switch transistor 44 is connected to the sequencer SQC via a signal line STI.

The latch circuits ADL, BDL, and CDL each have a substantially similar configuration as the latch circuit SDL. However, they are different in that the latch circuit SDL has the node LAT or the node INV connected to the sense amplifier SA.

The switch transistor DSW is an NMOS transistor as shown in FIG. 4, for example. The switch transistor DSW is connected between the wiring LBUS and the wiring DBUS. A gate electrode of the switch transistor DSW is connected to the sequencer SQC via a signal line DBS.

As shown in FIG. 4, each of the signal lines STB, HLL, XXL, BLX, BLC, and BLS is commonly connected among all the sense amplifier units SAUs in the sense amplifier module SAM. Each of the voltage supply line $V_{DD}$ and the voltage supply line $V_{SRC}$ described above is commonly connected among all the sense amplifier units SAUs in the sense amplifier module SAM. Each of the signal line STI and the signal line STL of the latch circuit SDL is commonly connected among all the sense amplifier units SAUs in the sense amplifier module SAM. Similarly, each of the signal lines ATI, ATL, BTI, BTL, CTI, and CTL in the latch circuits ADL, BDL, and CDL corresponding to the signal line STI and the signal line STL is commonly connected among all the sense amplifier units SAUs in the sense amplifier module SAM. In addition, a plurality of signal lines DBSs are provided corresponding to all the sense amplifier units SAUs in the sense amplifier module SAM.

The sense amplifier module SAM includes a cache memory, a decode circuit, and a switch circuit (not shown). As shown in FIG. 2, the cache memory includes a plurality of latch circuits XDLs respectively connected to a plurality of wirings DBUSs. The decode circuit decodes a column address CA stored in the address register ADR. The switch circuit brings a latch circuit XDL corresponding to the column address CA into conduction with a bus DB according to an output signal of the decode circuit.

The voltage generation circuit VG shown in FIG. 2 includes, for example, a step-up circuit such as a charge pump circuit, a step-down circuit such as a regulator, and a plurality of voltage supply lines (not shown). The step-up circuit and the step-down circuit are connected to power supply voltage supply terminals $V_{CC}$ and $V_{SS}$, respectively. The voltage generation circuit VG steps up or steps down a voltage between the power supply voltage supply terminals $V_{CC}$ and $V_{SS}$ according to an internal control signal from the sequencer SQC, generates a plurality of operation voltages to be supplied to the bit line BL, the source line SL, the word line WL, and the select gate lines (SGD, SGS) in a read operation, a write sequence, and an erase sequence for the memory cell array MCA, and simultaneously outputs the generated voltages from the plurality of voltage supply lines.

The sequencer SQC sequentially decodes command data CMD stored in the command register CMR, and outputs internal control signals to the row decoder RD, the sense amplifier module SAM, and the voltage generation circuit VG. The sequencer SQC appropriately outputs status data indicating a state thereof to the status register STR. For example, when performing the write sequence or the erase sequence, information indicating whether the write sequence or the erase sequence is normally ended is output as the status data.

The input/output control circuit I/O includes data input/output terminals I/O0 to I/O7, a shift register connected to the data input/output terminals I/O0 to I/O7, and a FIFO buffer connected to the shift register. According to an internal control signal from the logic circuit CTR, the input/output control circuit I/O outputs data that are input from the data input/output terminals I/O0 to I/O7 to the latch circuit XDL in the sense amplifier module SAM, the address register ADR, or the command register CMR. Data that is input from the latch circuit XDL or the status register STR is output to the data input/output terminals I/O0 to I/O7.

The logic circuit CTR receives an external control signal from the control die CD via external control terminals /CEn, CLE, ALE, /WE, and /RE, and outputs an internal control signal to the input/output control circuit I/O accordingly.

Figure 6:
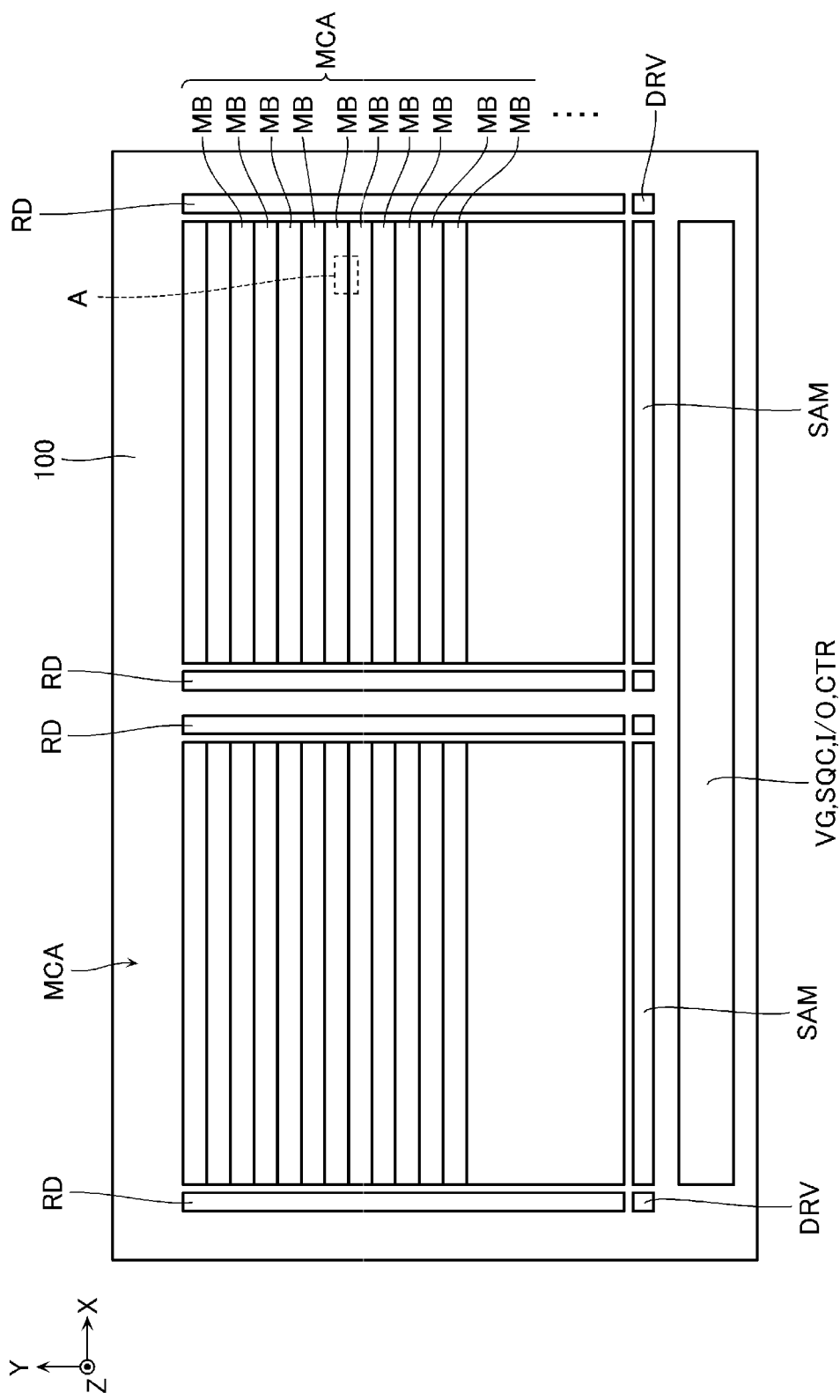
FIG. 6 is a schematic plan view of the memory die.
Figure 7:
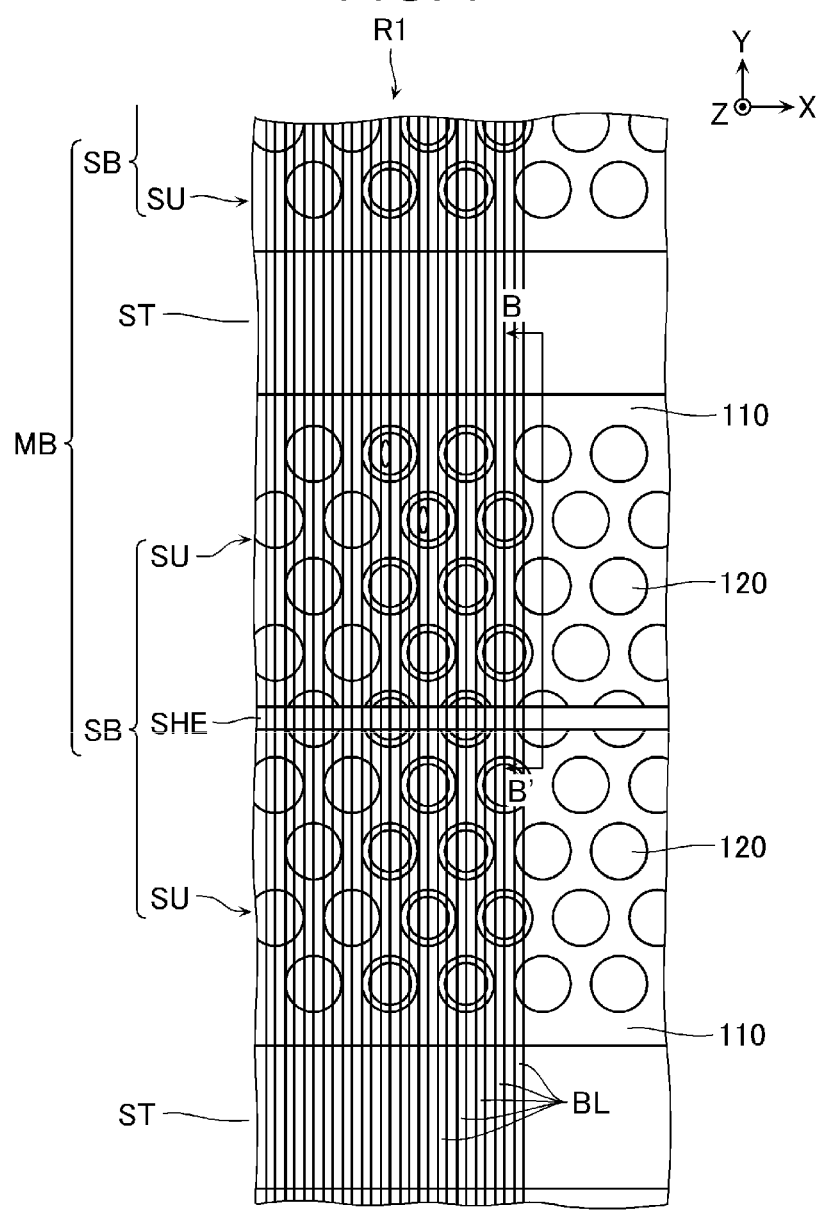
FIG. 7 is a schematic plan view of the memory cell array.
Figure 8:
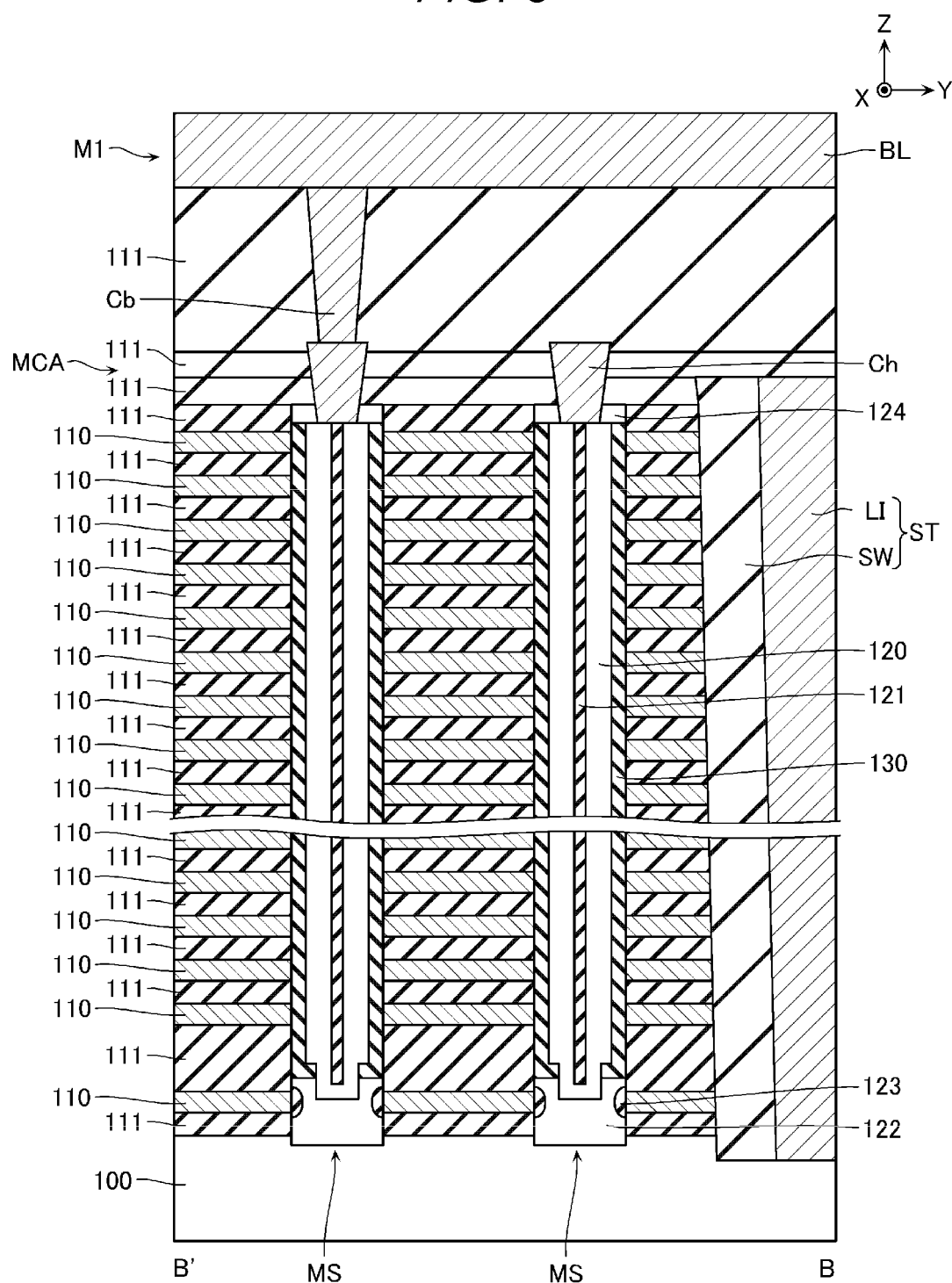
FIG. 8 is a schematic cross-sectional view of the memory cell array.
Figure 9:
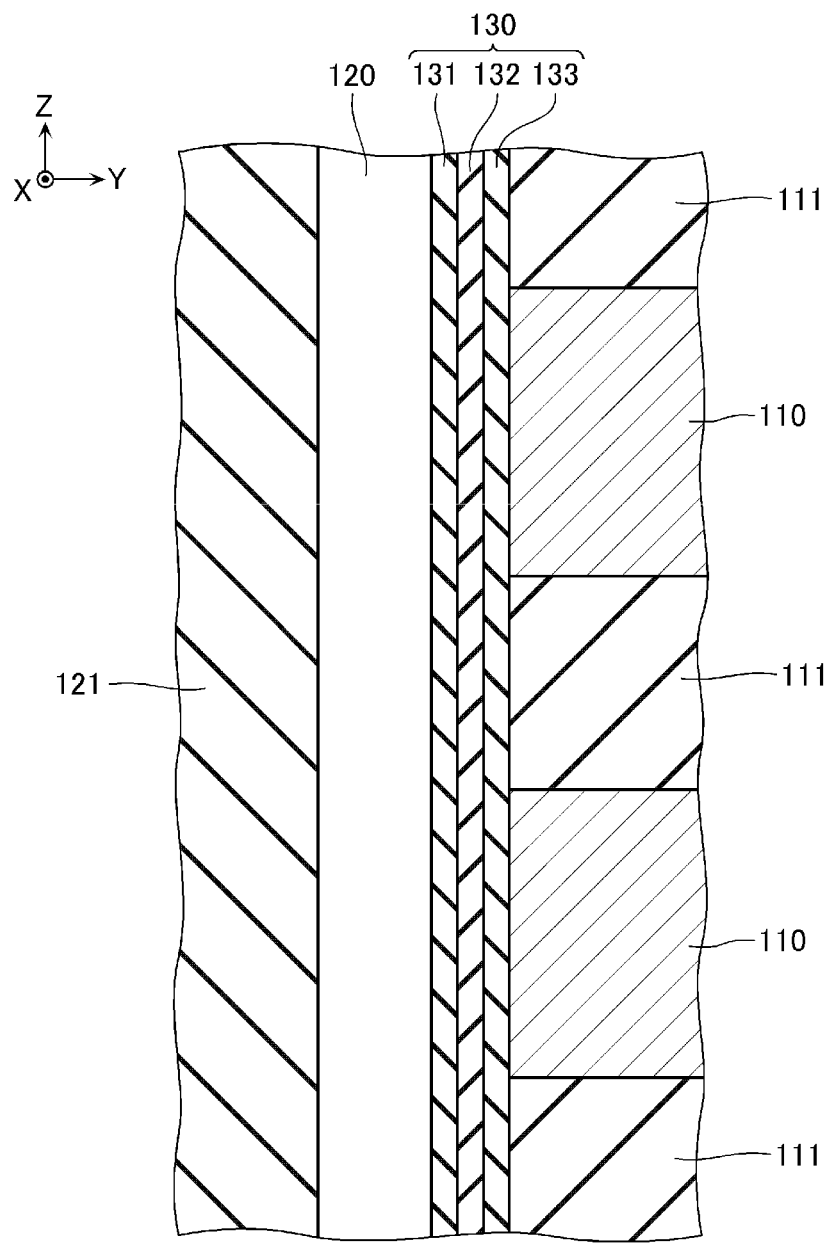
FIG. 9 is a schematic cross-sectional view of a memory cell.

Next, a configuration of the semiconductor storage device according to the present embodiment will be described with reference to FIGS. 6 to 9. FIG. 6 is a schematic plan view of the semiconductor storage device according to the present embodiment. FIG. 7 is a schematic enlarged view of a portion indicated by A in FIG. 6. FIG. 8 is a schematic cross-sectional view of the structure shown in FIG. 7 taken along a line B-B' and viewed from the X direction. FIG. 9 is a schematic enlarged view of FIG. 8. FIGS. 6 to 9 show schematic diagrams, and the detail of the structure may be changed as appropriate. In FIGS. 6 to 9, one or more elements may be omitted.

As shown in FIG. 6, the semiconductor storage device according to the present embodiment includes a semiconductor substrate 100. In the shown example, the semiconductor substrate 100 includes two memory cell arrays MCAs arranged in an X direction. Row decoders RDs are provided in regions extending in a Y direction along both end portions of the memory cell array MCA in the X direction. In addition, a sense amplifier module SAM is provided in a region extending in the X direction along the end portion of the memory cell array MCA in the Y direction. A driver circuit DRV that makes up a part of the row decoder RD is provided in a region near both end portions of the region where the sense amplifier module SAM is provided in the X direction. In addition, the voltage generation circuit VG, the sequencer SQC, the input/output control circuit I/O, and the logic circuit CTR are provided outside these regions.

The memory cell array MCA includes a plurality of memory blocks MBs arranged in the Y direction. As shown in FIG. 7, the memory block MB includes two sub-block structures SBs arranged in the Y direction. An inter-block structure ST extending in the X direction is provided between two sub-block structures SBs adjacent in the Y direction. The word lines WLs in the two memory blocks MBs are electrically insulated via the inter-block structure ST.

The sub-block structure SB includes two string units SUs arranged in the Y direction and an inter-sub-block insulating layer SHE provided between the two string units SUs.

As shown in FIG. 8, the string unit SU includes a plurality of conductive layers 110 provided above the semiconductor substrate 100, a plurality of semiconductor layers 120, and a plurality of gate insulating films 130 provided between the plurality of conductive layers 110 and the plurality of semiconductor layers 120.

The semiconductor substrate 100 is, for example, a semiconductor substrate of single crystal silicon (Si) containing P-type impurities or the like. An N-type well containing an N-type impurity such as phosphorus (P) is provided on a part of a surface of the semiconductor substrate 100. A part of a surface of the N-type well is provided with a P-type well containing a P-type impurity such as boron (B).

The conductive layer 110 is a substantially plate-shaped conductive layer extending in the X direction, and a plurality of the conductive layers 110 are arranged in the Z direction. The conductive layer 110 may include, for example, a stacked film of titanium nitride (TiN) and tungsten (W), or may include polycrystalline silicon containing impurities such as phosphorus or boron. An insulating layer 111 of silicon oxide ($SiO_2$) or the like is provided between the conductive layers 110.

Among the plurality of conductive layers 110, one or more conductive layers 110 located in a lowest layer function as source select lines SGSs shown in FIG. 3 and gate electrodes of the plurality of source select transistors STSs connected to the source select lines SGSs. In addition, a plurality of conductive layers 110 located above function as the word lines WLs shown in FIG. 3 and the gate electrodes of the plurality of memory cells MCs shown in FIG. 3 connected to the word lines WLs. Further, one or more conductive layers 110 located above function as drain select lines SGDs and gate electrodes of a plurality of drain select transistors STDs shown in FIG. 3 connected to the drain select lines SGDs.

As shown in FIG. 7, the plurality of semiconductor layers 120 are arranged in the X direction and the Y direction. The semiconductor layer 120 is, for example, a semiconductor film of non-doped polycrystalline silicon (Si) or the like. For example, as shown in FIG. 8, the semiconductor layer 120 has a substantially cylindrical shape, and an insulating film 121 of silicon oxide or the like is provided at a center portion of the semiconductor layer 120. An outer peripheral surface of the semiconductor layer 120 is surrounded by the conductive layer 110. A lower end portion of the semiconductor layer 120 is connected to a P-type well of the semiconductor substrate 100 via a semiconductor layer 122 of non-doped single crystal silicon or the like. The semiconductor layer 122 faces the conductive layer 110 via an insulating layer 123 of silicon oxide or the like. An upper end portion of the semiconductor layer 120 is connected to the bit line BL via a semiconductor layer 124 containing an N-type impurity such as phosphorus (P), and contacts Ch and Cb. Each of the semiconductor layers 120 functions as a channel region of a plurality of memory cells MCs and the drain select transistors STDs in one memory string MS shown in FIG. 3. The semiconductor layer 122 functions as a part of the channel region of the source select transistor STS.

For example, as shown in FIG. 9, the gate insulating film 130 includes a tunnel insulating film 131, a charge storage film 132, and a block insulating film 133 which are stacked between the semiconductor layer 120 and the conductive layer 110. The tunnel insulating film 131 and the block insulating film 133 are, for example, insulating films of silicon oxide or the like. The charge storage film 132 is, for example, a film capable of accumulating charges of silicon nitride (SiN) or the like. The tunnel insulating film 131, the charge storage film 132, and the block insulating film 133 each have a substantially cylindrical shape, and extend in the Z direction along the outer peripheral surface of the semiconductor layer 120.

FIG. 9 shows an example of the gate insulating film 130 including the charge storage film 132 of silicon nitride or the like. The gate insulating film 130 may include a floating gate of polycrystalline silicon containing N-type or P-type impurities or the like.

For example, as shown in FIG. 8, the inter-block structure ST includes a conductive layer LI extending in the Z direction and an insulating layer SW provided between the conductive layer LI and a plurality of conductive layers 110.

The conductive layer LI is a substantially plate-shaped conductive layer extending in the Z direction and the X direction, and functions as a part of the source line SL. The conductive layer LI may include, for example, a stacked film of titanium nitride (TiN) and tungsten (W), or may include polycrystalline silicon containing impurities such as phosphorus or boron, or may contain silicide. The insulating layer SW is, for example, an insulating layer of silicon oxide (SiO$_2$) or the like.

[Threshold Voltage of Memory Cell MC]

Figure 10:
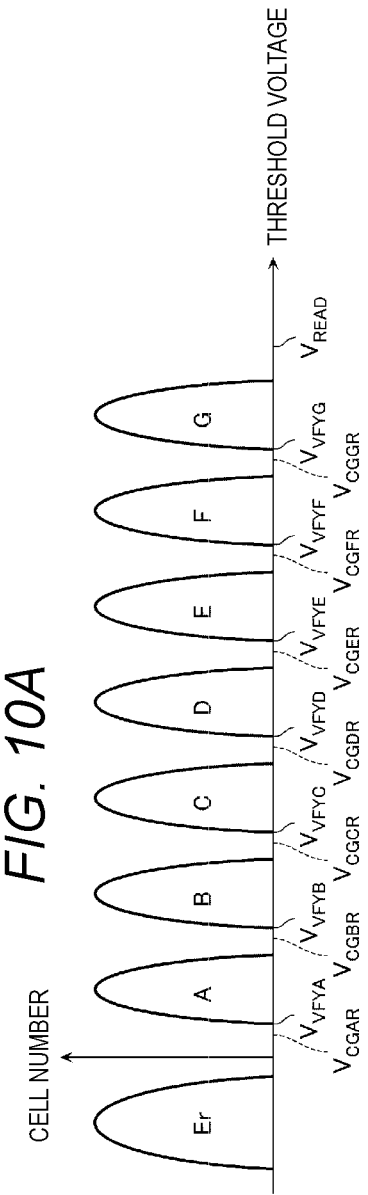
FIG. 10A is a schematic histogram showing a threshold voltage distribution of memory cells.
FIGS. 10B and 10C are schematic diagrams showing the threshold voltage and data recorded in the memory cell.

Next, the threshold voltage of the memory cell MC will be described with reference to FIGS. 10A to 10C. FIG. 10A is a schematic histogram showing the threshold voltage of the memory cell MC. A horizontal axis indicates a voltage of the memory cell MC, and a vertical axis indicates the number of the memory cells MCs. FIG. 10B shows an example of the threshold voltage of the memory cell MC and data recorded in the memory cell MC. FIG. 10C shows another example of the threshold voltage of the memory cell MC and the data recorded in the memory cell MC.

As described above, the memory cell array MCA includes a plurality of memory cells MCs. When a write sequence is performed in the plurality of memory cells MCs, the threshold voltage of the memory cell MC is controlled to be one of a plurality of states. FIG. 10A shows a threshold voltage distribution of the memory cell MC controlled in eight states. For example, a threshold voltage of the memory cell MC controlled to be an A state is larger than a read voltage $V_{CGAR}$ and a verification voltage $V_{VFYA}$ in FIG. 10A, and is smaller than a read voltage $V_{CGBR}$ and a verification voltage $V_{VFYB}$. In addition, threshold voltages of all the memory cells MCs are smaller than a read pass voltage $V_{READ}$ in FIG. 10A.

In the present embodiment, 3-bit data is recorded in each memory cell MC by adjusting the memory cell MC to eight states.

For example, an Er state corresponds to a lowest threshold voltage (i.e., a threshold voltage of the memory cell MC in an erased state). For example, data "111" is allocated to the memory cell MC corresponding to the Er state.

The A state corresponds to a threshold voltage higher than the threshold voltage corresponding to the Er state. For example, data "101" is allocated to the memory cell MC corresponding to the A state.

AB state corresponds to a threshold voltage higher than the threshold voltage corresponding to the A state. For example, data "001" is allocated to the memory cell MC corresponding to the B state.

Similarly, in the drawing, C to G states correspond to threshold voltages higher than the threshold voltages corresponding to the B to F states. For example, data "011", "010", "110", "100", and "000" are allocated to the memory cells MC corresponding to these distributions.

In the case of the allocation as shown in FIG. 10B, lower bit data may be determined by one read voltage $V_{CGAR}$, middle bit data may be determined by three read voltages $V_{CGAR}$, $V_{CGCR}$, and $V_{CGAR}$, and upper bit data may be determined by three read voltages $V_{CGAR}$, $V_{CGER}$, and $V_{CGGR}$. Such data allocation may be referred to as a 1-3-3 code.

The number of bits of data to be recorded in the memory cell MC, the number of states, and the allocation of data to each state may be changed as appropriate.

For example, in the case of the allocation as shown in FIG. 10C, the lower bit data may be determined by one read voltage $V_{CGAR}$, the middle bit data may be determined by two read voltages $V_{CGBR}$ and $V_{CGAR}$, and the upper bit data may be determined by four read voltages $V_{CGAR}$, $V_{CGAR}$, $V_{CGER}$, and $V_{CGGR}$. Such data allocation may be referred to as a 1-2-4 code.

[Read Operation]

Figure 11:
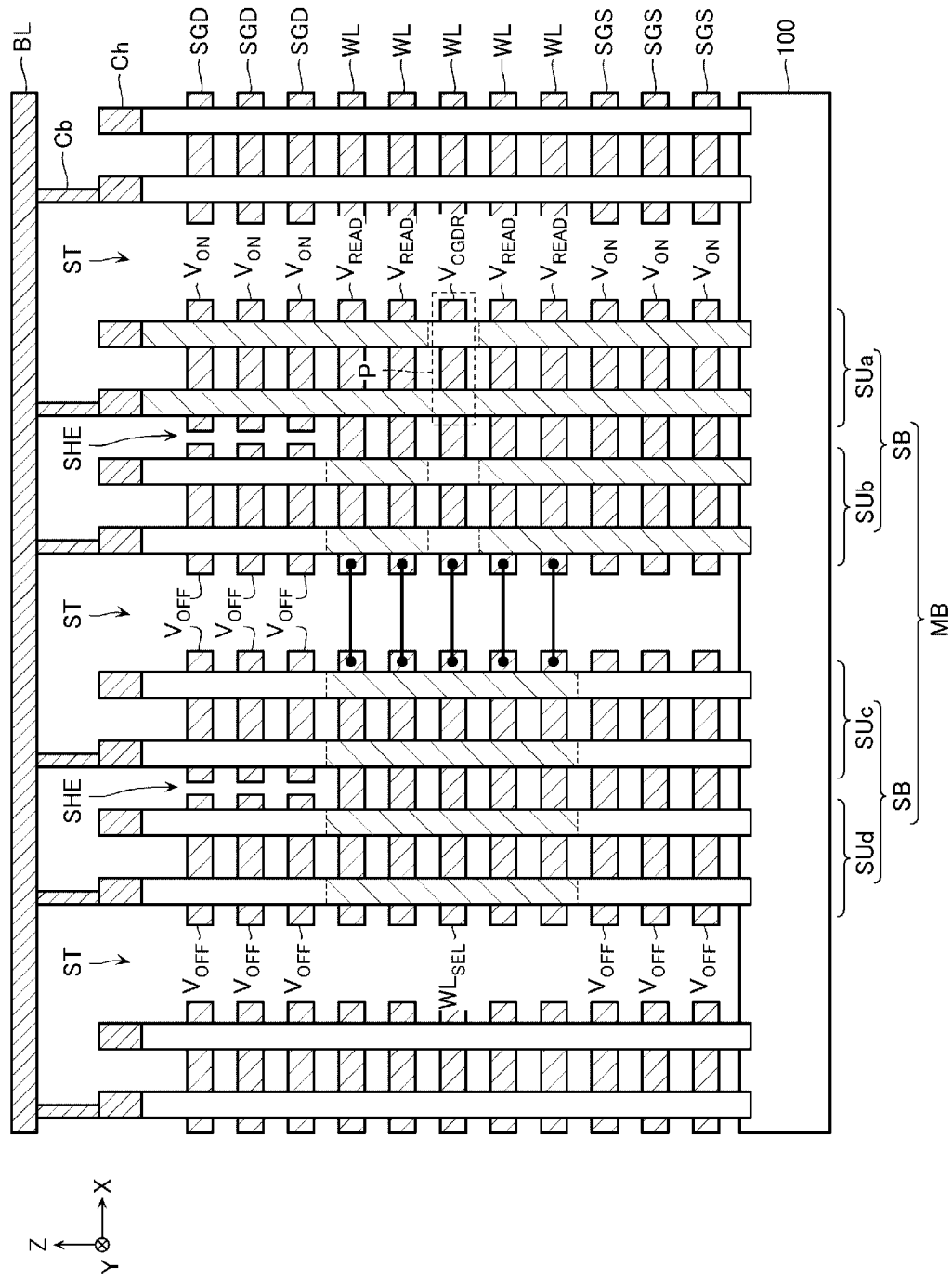
FIG. 11 is a schematic cross-sectional view of the memory cell array for explaining a read operation.

Next, the read operation of the semiconductor storage device according to the present embodiment will be described with reference to FIGS. 10A to 10C and FIG. 11. FIG. 11 is a schematic cross-sectional view of the memory cell array for explaining a read operation. In the following description, an example in which data is allocated according to the 1-3-3 code in FIG. 10B will be described.

When reading the lower bit data, for example, as shown in FIG. 11, a plurality of selected memory cells MC in a selected page P are selectively brought into conduction with the bit line BL and the source line SL. For example, an ON voltage $V_{ON}$ is supplied to the drain select line SGD and the source select line SGS corresponding to the selected page P, and the select transistors (STD, STS) are in an ON state. An OFF voltage $V_{OFF}$ is supplied to other drain select line SGD and source select line SGS, and the select transistors (STD, STS) are in an OFF state. The read pass voltage $V_{READ}$ is supplied to a non-selected word line WL corresponding to a non-selected page, and all the memory cells MCs connected to the non-selected word line WL are in an ON state.

As shown in FIG. 11, the read voltage $V_{CGDR}$ is supplied to the selected word line WL corresponding to the selected page P. Accordingly, the memory cells MCs corresponding to the Er state to the C state in FIG. 10A are in an ON state, and the memory cells MCs corresponding to the D state to the G state are in the OFF state.

The sense amplifier SA detects an ON/OFF state of the selected memory cell MC. For example, when the wiring LBUS in FIG. 5 is charged, and the signal line STL is set to an "H" state, "H" is stored in the latch circuit SDL. In addition, when the signal lines HLL, BLX, and BLC are set to the "H" state, the charge of the bit line BL and the sense node SEN is started. When the signal line HLL is switched from the "H" state to an "L" state, and the signal line XXL is switched from the "L" state to the "H" state, the charge of the sense node SEN is discharged to the bit line BL. Here, a voltage of the sense node SEN connected to the bit line BL corresponding to the memory cell MC in an ON state is relatively greatly reduced. On the other hand, the voltage of the sense node SEN connected to the bit line BL corresponding to the memory cell MC in an OFF state is not greatly reduced. Therefore, by setting the signal line STB to the "H" state at a predetermined timing to discharge or maintain the charge of the wiring LBUS, and setting the signal line STL to the "H" state again, "L" and "H" are latched in the latch circuit SDL corresponding to the selected memory cells MCs in the ON state and the OFF state.

Thereafter, data latched in the latch circuit SDL is output to, for example, the control die CD via the wiring LBUS, the latch circuit XDL, the bus DB, and the input/output control circuit I/O. The control die CD performs bit error detection/correction on the data and then transfers the obtained data to the host computer 20.

When reading the middle bit data, for example, the selected memory cell MC is selectively brought into conduction with the bit line BL and the source line SL. Next, for example, the read voltage $V_{CGAR}$ is supplied to the selected word line WL, the ON/OFF state of the selected memory cell MC is detected, and data of the latch circuit SDL is transferred to the latch circuit ADL. Similarly, the read voltage $V_{CGCR}$ is supplied to the selected word line WL, the ON/OFF state of the selected memory cell MC is detected, and data of the latch circuit SDL is transferred to the latch circuit BDL. Similarly, the read voltage $V_{CGFR}$ is supplied to the selected word line WL, the ON/OFF state of the selected memory cell MC is detected, and data of the latch circuit SDL is transferred to the latch circuit CDL. Next, arithmetic processing such as exclusive OR is performed among the latch circuits ADL, BDL, and CDL to calculate the middle bit data of the selected memory cell MC. Thereafter, the calculated data is output.

When reading the upper bit data, for example, the selected memory cell MC is selectively brought into conduction with the bit line BL and the source line SL. Next, for example, the read voltage $V_{CGBR}$ is supplied to the selected word line WL, the ON/OFF state of the selected memory cell MC is detected, and data of the latch circuit SDL is transferred to the latch circuit ADL. Similarly, the read voltage $V_{CGER}$ is supplied to the selected word line WL, the ON/OFF state of the selected memory cell MC is detected, and data of the latch circuit SDL is transferred to the latch circuit BDL. Similarly, the read voltage $V_{CGGR}$ is supplied to the selected word line WL, the ON/OFF state of the selected memory cell MC is detected, and data of the latch circuit SDL is transferred to the latch circuit CDL. Next, arithmetic processing such as exclusive OR is performed among the latch circuits ADL, BDL, and CDL to calculate the upper bit data of the selected memory cell MC. Thereafter, the calculated data is output.

[Write Sequence]

Figure 12:
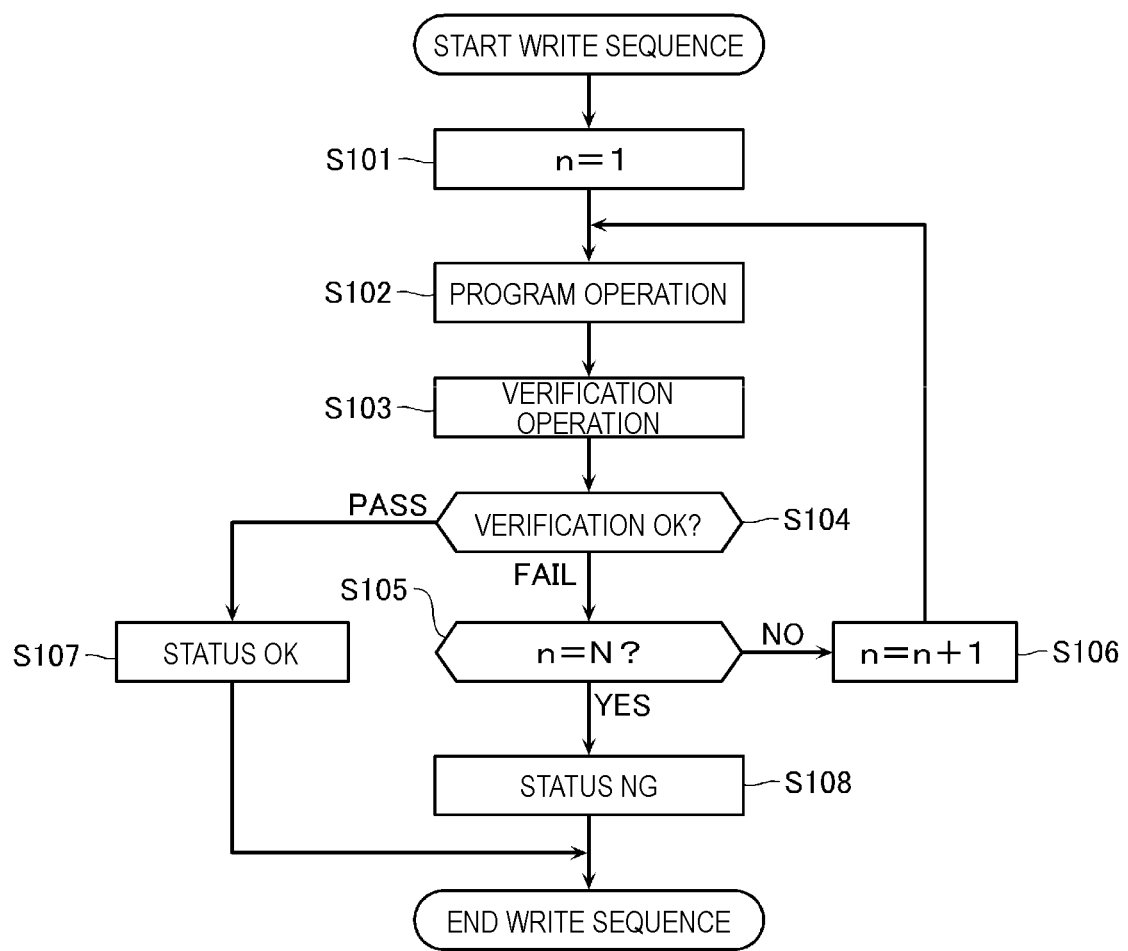
FIG. 12 is a schematic flowchart of a write sequence.
Figure 13:
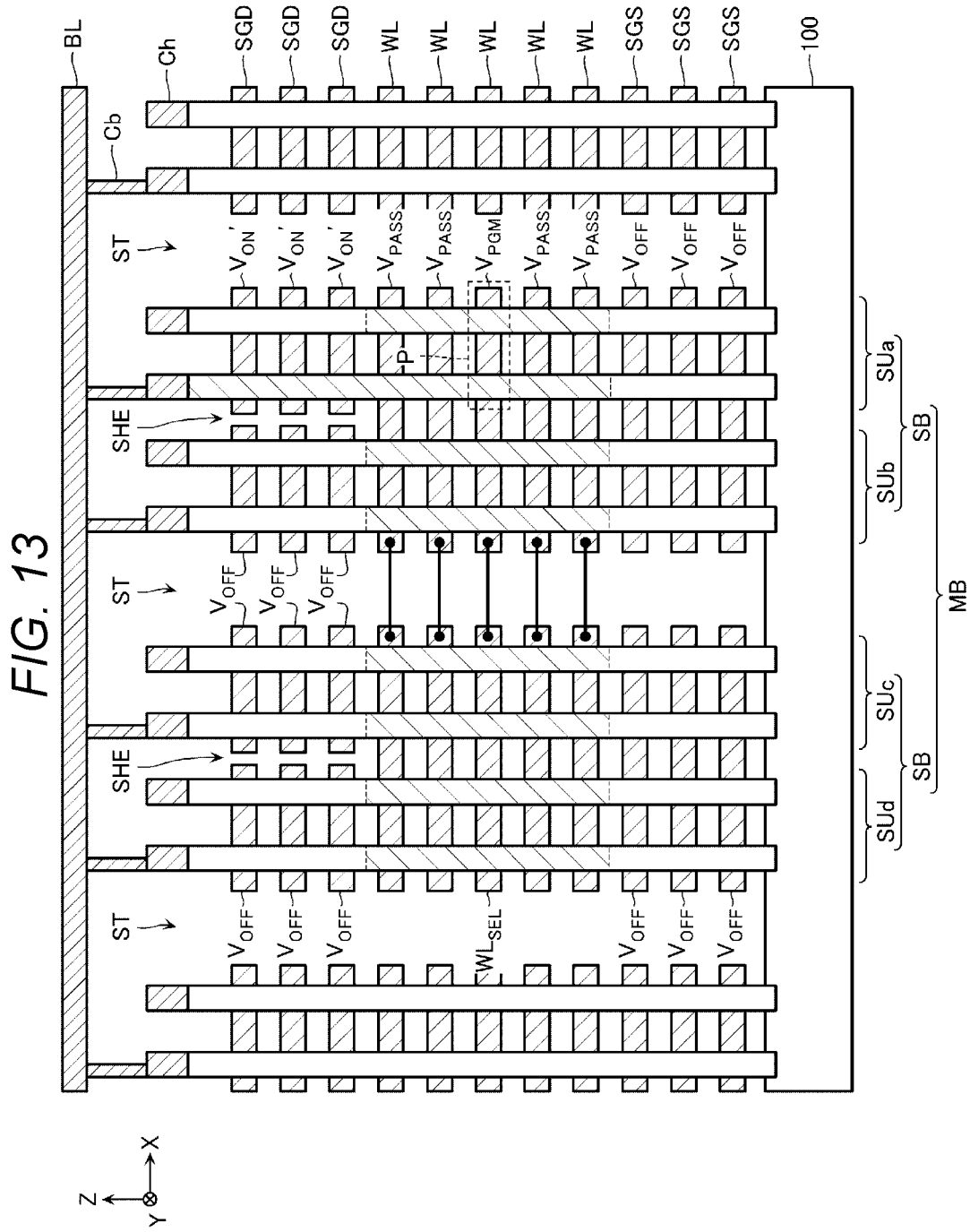
FIG. 13 is a schematic cross-sectional view of the memory cell array for explaining a program operation.
Figure 14:
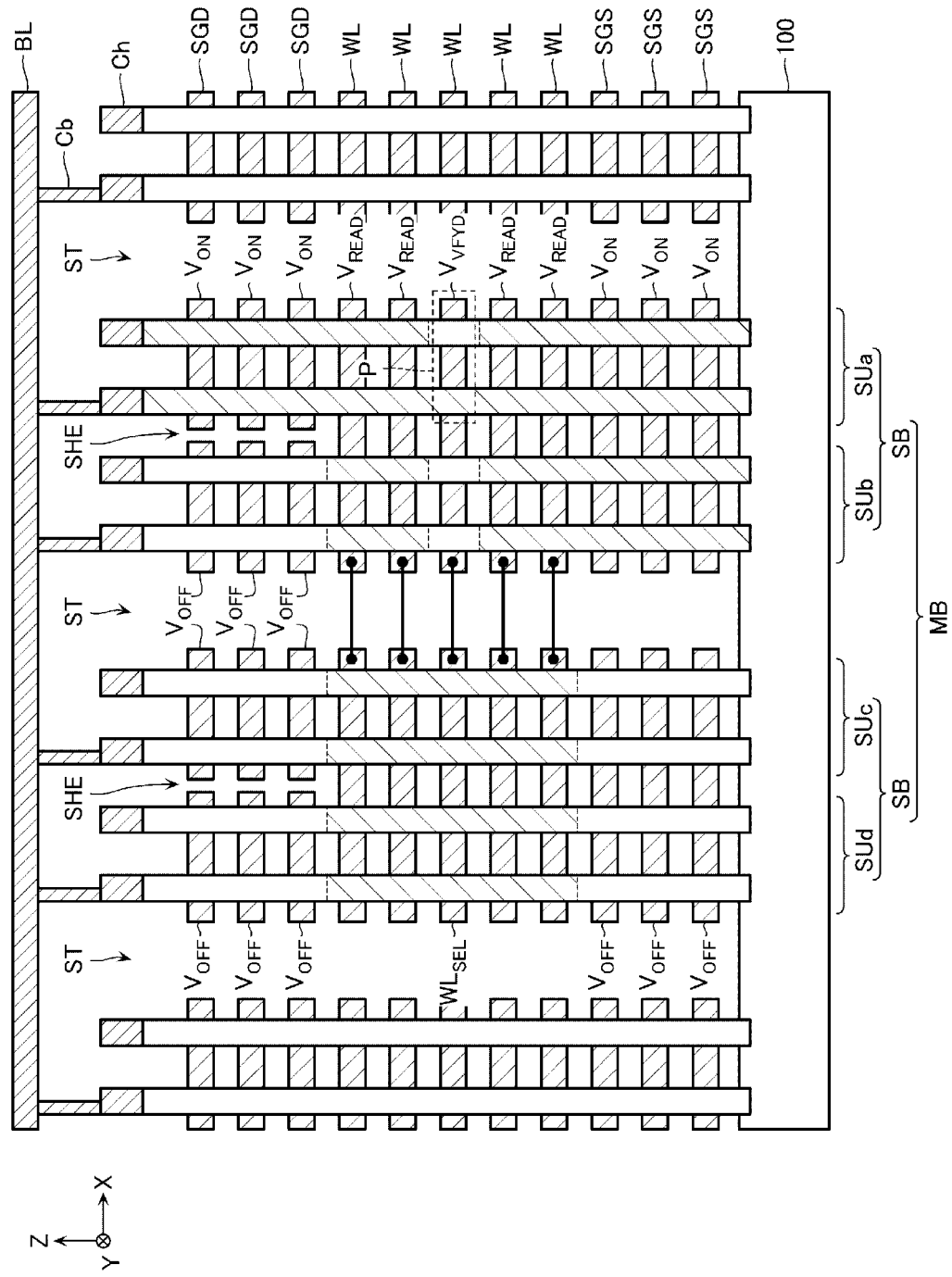
FIG. 14 is a schematic cross-sectional view of the memory cell array for explaining a verification operation.
Figure 15:
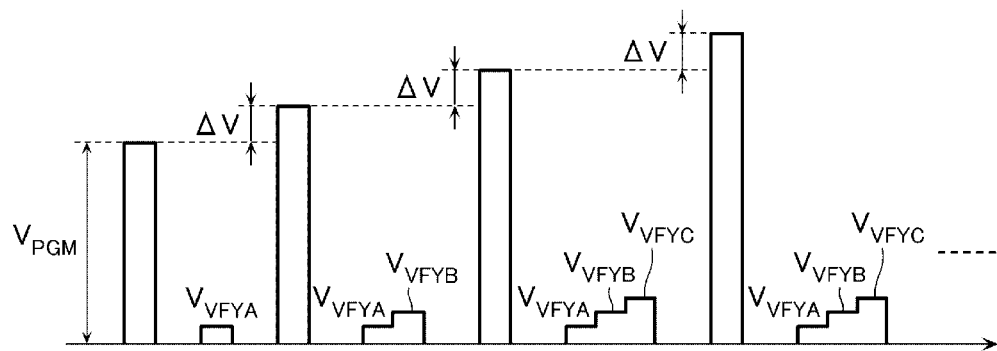
FIG. 15 is a schematic graph showing a voltage supplied to a selected word line WL during the write sequence.

Next, a write sequence of the semiconductor storage device will be described with reference to FIGS. 12 to 15. The write sequence includes a program operation and a verification operation. FIG. 12 is a schematic flowchart of the write sequence. FIG. 13 is a schematic cross-sectional view of the memory cell array for explaining the program operation. FIG. 14 is a schematic cross-sectional view of the memory cell array for explaining the verification operation. FIG. 15 is a schematic graph showing a voltage supplied to the selected word line WL during the write sequence.

In step S101, for example, as shown in FIG. 12, a loop number n is set to 1. The loop number n is recorded in a register.

In step S102, the program operation is performed.

In the program operation, for example, different voltages are supplied to the bit line BL connected to the memory cell MC whose threshold voltage is adjusted and the bit line BL connected to the memory cell MC whose threshold voltage is not adjusted. For example, the node LAT of the latch circuit SDL shown in FIG. 5 corresponding to the former is set to "H", and the node LAT of the latch circuit SDL corresponding to the latter is set to "L". The signal lines BLX and BLC are set to "H". For example, a ground voltage is supplied to the bit line BL corresponding to the former via a ground voltage supply terminal. For example, a predetermined program inhibit voltage is supplied to the bit line BL corresponding to the latter via the voltage supply line $V_{DD}$.

As shown in FIG. 13, the memory cell MC whose threshold voltage is adjusted is selectively brought into conduction with the bit line BL. For example, an ON voltage $V_{ON}'$ is supplied to the drain select line SGD corresponding to the selected page P, and the OFF voltage $V_{OFF}$ is supplied to other drain select lines SGDs. For example, the ON voltage $V_{ON}'$ may be smaller than the ON voltage $V_{ON}$ in FIG. 11. Accordingly, the drain select transistor STD corresponding to the bit line BL supplied with a ground voltage is in an ON state, and the drain select transistor STD corresponding to the bit line BL supplied with the program inhibit voltage is in an OFF state. A write pass voltage $V_{PASS}$ is supplied to a non-selected word line WL corresponding to a non-selected page. The write pass voltage $V_{PASS}$ is larger than, for example, the read pass voltage $V_{READ}$ in FIG. 11.

As shown in FIG. 13, a program voltage $V_{PGM}$ is supplied to the selected word line WL. The program voltage $V_{PGM}$ is larger than the write pass voltage $V_{PASS}$. Accordingly, electrons are accumulated in the charge storage film 132 of the desired memory cell MC shown in FIG. 9, and the threshold voltage of the memory cell MC increases.

In step S103 of FIG. 12, a verification operation is performed. In the verification operation, for example, as shown in FIG. 14, similarly to the read operation, the selected memory cell MC is selectively brought into conduction with the bit line BL and the source line SL. Next, for example, at least one of verification voltages $V_{VFYA}$, $V_{VFYB}$, $V_{VFYC}$, $V_{VFYD}$, $V_{VFYE}$, $V_{VFYF}$ and $V_{VFYG}$ shown in FIG. 10A is supplied to the selected word line WL, the ON/OFF state of the selected memory cell MC is detected, and data of the latch circuit SDL is transferred to the latch circuit XDL.

For example, as shown in FIG. 15, in one verification operation, a plurality of different verification voltages may be sequentially supplied to the selected word line WL. For example, when the selected page P includes a plurality of memory cells MCs corresponding to the A state to the C state, the following operation may be performed in one verification operation. For example, the selected memory cell MC is selectively brought into conduction with the bit line BL and the source line SL. Next, the verification voltage $V_{VFYA}$ is supplied to the selected word line WL, the ON/OFF state of the selected memory cell MC corresponding to the A state is detected, data of the latch circuit SDL is transferred to any one of the latch circuits ADL, BDL, and CDL. Next, the verification voltage $V_{VFYB}$ is supplied to the selected word line WL, the ON/OFF state of the selected memory cell MC corresponding to the B state is detected, and data of the latch circuit SDL is transferred to anyone of the latch circuits ADL, BDL, and CDL. Next, the verification voltage $V_{VFYC}$ is supplied to the selected word line WL, the ON/OFF state of the selected memory cell MC corresponding to the C state is detected, and data of the latch circuit SDL is transferred to any one of the latch circuits ADL, BDL, and CDL. Thereafter, the data transferred to any one of the latch circuits ADL, BDL, and CDL is transferred to the latch circuit XDL.

In step S104 of FIG. 12, a result of the verification operation is determined. For example, when data stored in the latch circuit XDL includes "L" above a certain level, it is determined as verification FAIL, and the processing proceeds to step S105. On the other hand, when data stored in the latch circuit XDL does not include "L" above a certain level, it is determined as verification PASS, and the processing proceeds to step S107.

In step S105, it is determined whether the loop number n reaches a predetermined number N. If not, the processing proceeds to step S106. If so, the processing proceeds to step S108.

In step S106, the loop number n is incremented, and the processing proceeds to step S102. In step S106, for example, as shown in FIG. 15, a predetermined voltage AV is added to the program voltage $V_{PGM}$.

In step S107, status data indicating that the write sequence is normally ended is stored in the status register STR shown in FIG. 2, and is output to the control die CD shown in FIG. 1, and the write sequence is ended.

In step S108, status data indicating that the write sequence is not normally ended is stored in the status register STR shown in FIG. 2, and is output to the control die CD shown in FIG. 1, and the write sequence is ended.

[Program Operation]

Figure 16:
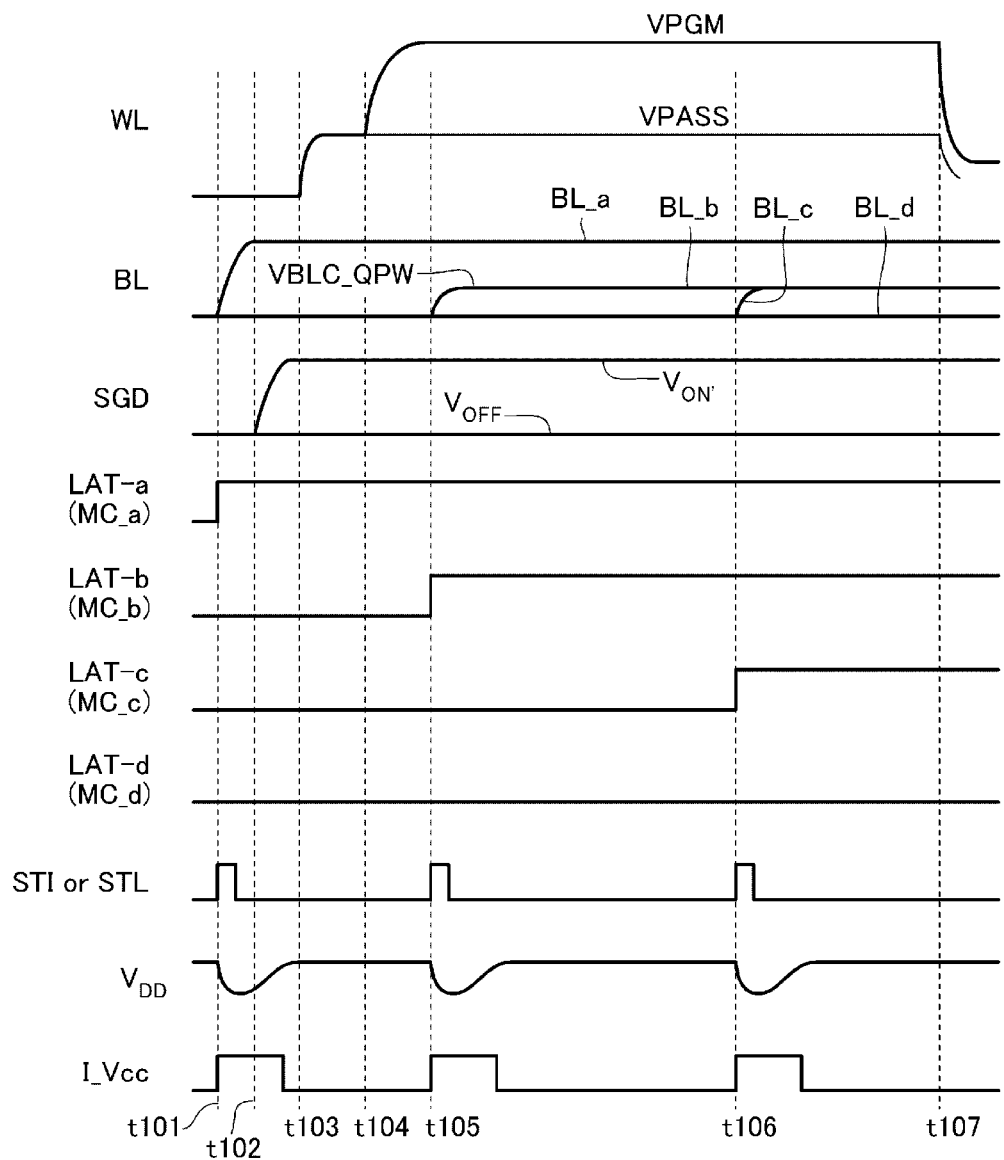
FIG. 16 is a schematic timing chart showing the program operation.

Next, the program operation will be described in more detail with reference to FIG. 16. FIG. 16 is a schematic timing chart showing the program operation.

In the program operation according to the present embodiment, a voltage of the bit line BL is adjusted. Accordingly, a voltage between a channel (i.e., an inversion layer) and the gate electrode of the memory cell whose threshold voltage is adjusted (hereinafter referred to as "channel-gate voltage") and a channel-gate voltage of the memory cell whose threshold voltage is not adjusted have different magnitudes. By sequentially switching the channel-gate voltage of the memory cell whose threshold voltage is adjusted, an amount of electrons accumulated in the charge storage film 132 of each memory cell MC is adjusted in a plurality of stages.

In FIG. 16, "MC_a" indicates a memory cell MC whose threshold voltage is not adjusted. "BL_a" indicates a bit line BL connected to the memory cell MC_a, and "LAT_a" indicates a node LAT of the latch circuit SDL corresponding to the memory cell MC_a. In addition, in FIG. 16, "MC_b" indicates a memory cell MC whose threshold voltage is adjusted. "BL_b" indicates a bit line BL connected to the memory cell MC_b, and "LAT_b" indicates a node LAT of the latch circuit SDL corresponding to the memory cell MC_b. Further, in FIG. 16, "MC_c" indicates a memory cell MC whose threshold voltage is adjusted more strongly than the memory cell MC_b. "BL_c" indicates a bit line BL connected to the memory cell MC_c, and "LAT_c" indicates a node LAT of the latch circuit SDL corresponding to the memory cell MC_c. Furthermore, in FIG. 16, "MC_d" indicates a memory cell MC whose threshold voltage is adjusted more strongly than the memory cell MC_c. "BL_d" indicates a bit line BL connected to the memory cell MC_d, and "LAT_d" indicates a node LAT of the latch circuit SDL corresponding to the memory cell MC_d.

At the start of the program operation, the word line WL is in a floating state, and the voltage of the word line WL is about the ground voltage. The OFF voltage $V_{OFF}$ is supplied to the drain select line SGD. States of the nodes LAT_a, LAT_b, LAT_c, and LAT_d are (L, L, L, L), the charge transistor 37 shown in FIG. 5 connected to the bit lines BL_a, BL_b, BL_c, and BL_d is in an OFF state, and the discharge transistor 40 shown in FIG. 5 is in an ON state. In addition, a program inhibit voltage is supplied to the voltage supply line $V_{DD}$, and a ground voltage is supplied to the voltage supply line $V_{SRC}$. Accordingly, the ground voltage is supplied to the bit lines BL_a, BL_b, BL_c, and BL_d.

At a timing t101, data in the latch circuit SDL connected to the memory cell MC_a is inverted. For example, the voltage of the signal line STI or the signal line STL rises, the states of the nodes LAT_a, LAT_b, LAT_c, and LAT_d are (H, L, L, L), and the voltage of the signal line STI or the signal line STL falls. Accordingly, the charge transistor 37 shown in FIG. 5 connected to the bit line BL_a is in an ON state, and the program inhibit voltage is supplied to the node COM connected to the bit line BL_a. At this timing, a sufficiently large voltage is supplied to the gate electrode of the clamp transistor 34, and a program inhibit voltage is supplied to the bit line BL_a.

At the timing t101, the charge of the bit line BL_a is started, and thus a voltage of the voltage supply line $V_{DD}$ may temporarily fall. In order to step up the voltage of the voltage supply line $V_{DD}$, power is consumed in the voltage generation circuit VG, and the current flowing through the power supply voltage supply terminals $V_{CC}$ and $V_{SS}$ may temporarily increase.

At a timing t102, the ON voltage $V_{ON}'$ is supplied to the drain select line SGD corresponding to the selected page P. Accordingly, the drain select transistor STD connected to the memory cell MC_a is in an OFF state, and the drain select transistor STD connected to the memory cells MC_b, MC_c, and MC_d is in an ON state.

At a timing t103, the write pass voltage $V_{PASS}$ is supplied to the word line WL. Here, the drain select transistor STD corresponding to the memory cell MC_a is in an OFF state. Therefore, a voltage of the channel (i.e., the inversion layer) of the memory cell MC_a rises due to capacitive coupling with the word line WL. On the other hand, the drain select transistors STD corresponding to the memory cells MC_b, MC_c, and MC_d are in an ON state. Therefore, the voltages of the channels of the memory cells MC_b, MC_c, and MC_d are about the ground voltage, similarly to the bit lines BL_b, BL_c, and BL_d.

At a timing t104, the program voltage $V_{PGM}$ is supplied to the selected word line WL. Here, the voltage of the channel (i.e., the inversion layer) of the memory cell MC_a rises due to capacitive coupling with the word line WL. Therefore, no electrons are accumulated in the charge storage film 132 of the memory cell MC_a shown in FIG. 9. On the other hand, the voltages of the channels of the memory cells MC_b, MC_c, and MC_d are about the ground voltage. Therefore, electrons are accumulated in the charge storage film 132 of the memory cells MC_b, MC_c, and MC_d shown in FIG. 9.

At a timing t105, data in the latch circuit SDL connected to the memory cell MC_b is inverted, and the states of the nodes LAT_a, LAT_b, LAT_c, and LAT_d are (H, H, L, L). Accordingly, the charge transistor 37 shown in FIG. 5 connected to the bit line BL_b is in an ON state, and the program inhibit voltage is supplied to the node COM connected to the bit line BL_b. At this timing, a relatively small voltage is supplied to the gate electrode of the clamp transistor 34, and voltages of the bit line BL_b and a channel of the memory cell MC_b are clamped by the clamp transistor 34. That is, a voltage VBLC_QPW having a magnitude about a value obtained by subtracting a threshold voltage of the clamp transistor 34 from a gate voltage of the clamp transistor 34 is transferred to the bit line BL_b and the channel of the memory cell MC_b. Accordingly, a voltage between the channel and the gate electrode of the memory cell MC_b falls, and a speed at which electrons are accumulated in the charge storage film 132 of the memory cell MC_b decreases.

At the timing t105, the charge of the bit line BL_b is started, and thus the voltage of the voltage supply line $V_{DD}$ may temporarily fall. In order to step up the voltage of the voltage supply line $V_{DD}$, power is consumed in the voltage generation circuit VG, and the current flowing through the power supply voltage supply terminals $V_{CC}$ and $V_{SS}$ may temporarily increase.

At a timing t106, data in the latch circuit SDL connected to the memory cell MC_c is inverted, and the states of the nodes LAT_a, LAT_b, LAT_c, and LAT_d are (H, H, H, L). Accordingly, the charge transistor 37 shown in FIG. 5 connected to the bit line BL_c is in an ON state, and the program inhibit voltage is supplied to the node COM connected to the bit line BL_c. At this timing, a relatively small voltage is supplied to the gate electrode of the clamp transistor 34. Therefore, voltages of the bit line BL_c and a channel of the memory cell MC_c become the voltage VBLC_QPW having a magnitude same as the voltages of the bit line BL_b and the channel of the memory cell MC_b. Accordingly, a voltage between the channel and the gate electrode of the memory cell MC_c falls, and a speed at which electrons are accumulated in the charge storage film 132 of the memory cell MC_c decreases.

At the timing t106, the charge of the bit lines BL_c is started, and thus the voltage of the voltage supply line $V_{DD}$ may temporarily fall. In order to step up the voltage of the voltage supply line $V_{DD}$, power is consumed in the voltage generation circuit VG, and the current flowing through the power supply voltage supply terminals $V_{CC}$ and $V_{SS}$ may temporarily increase.

At a timing t107, the discharge of the word line WL, the bit line BL, and the drain select line SGD is started.

[Verification Operation]

Figure 17:
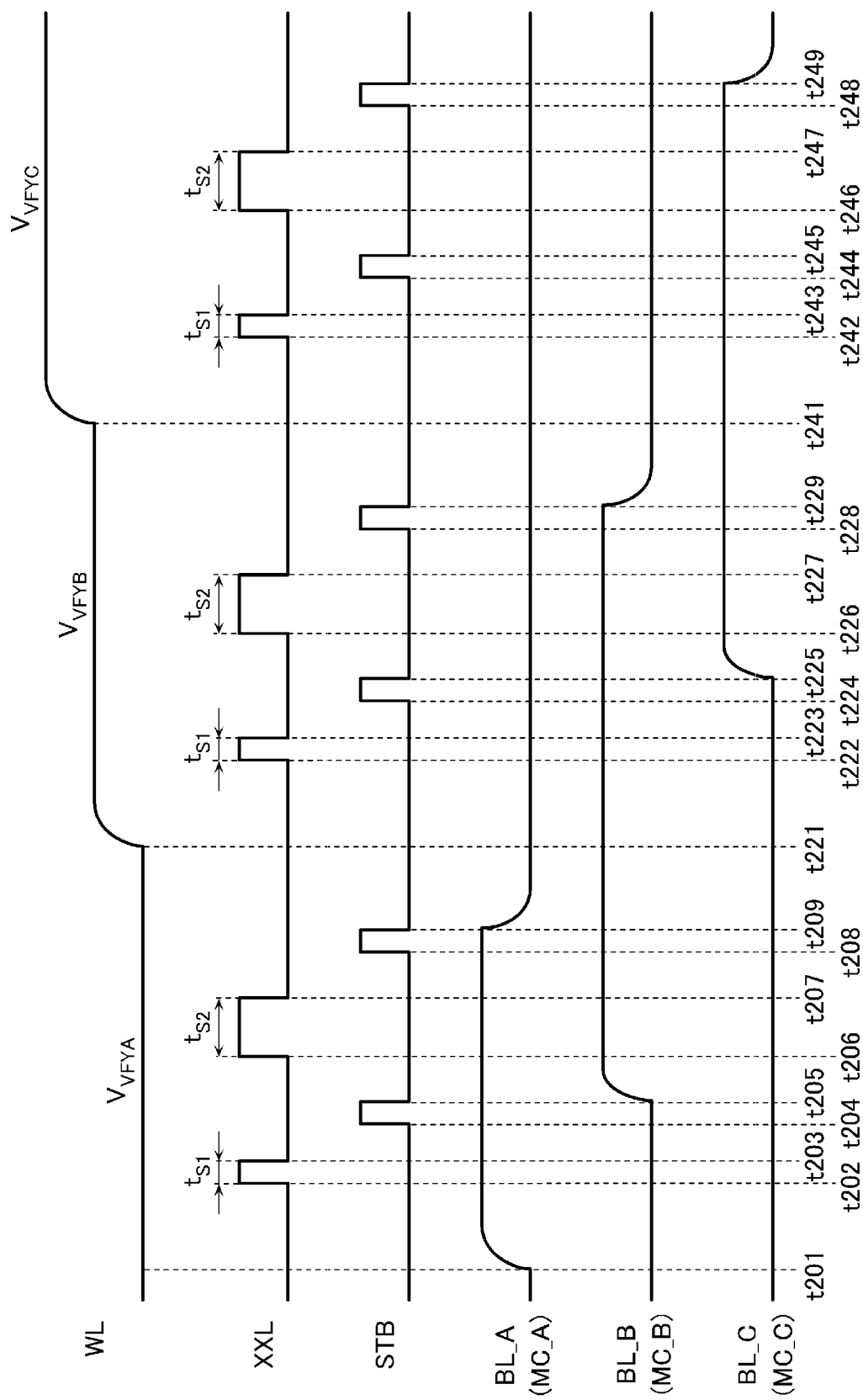
FIG. 17 is a schematic timing chart showing the verification operation.

Next, the verification operation will be described in more detail with reference to FIG. 17. FIG. 17 is a schematic timing chart showing the verification operation. In the following description, an example in which the verification operation is performed on the memory cells MC in the A state, the B state, and the C state will be described.

In the verification operation according to the present embodiment, the selected memory cell MC is classified into one of the above-described four memory cells MC_a, MC_b, MC_c, and MC_d according to the threshold voltage of the selected memory cell MC.

In FIG. 17, "MC_A" indicates a selected memory cell MC corresponding to the A state. "BL_A" indicates a bit line BL connected to the memory cell MC_A. In addition, in FIG. 17, "MC_B" indicates a selected memory cell MC corresponding to the B state. "BL_B" indicates a bit line BL connected to the memory cell MC_B. Further, in FIG. 17, "MC_C" indicates a selected memory cell MC corresponding to the C state. "BL_C" indicates a bit line BL connected to the memory cell MC_C.

In a verification operation at a predetermined timing, the verification voltage $V_{VFYA}$ is supplied to the selected word line. A voltage about the ground voltage is supplied to the bit lines BL_A, BL_B, and BL_C. States of the signal lines STB, XXL, BLC, HLL, and BLX shown in FIG. 5 are (L, L, L, L, L). States of the latch circuit SDL corresponding to the memory cells MC_A, MC_B, and MC_C are (H, L, L).

At a timing t201, the states of the signal lines BLC, HLL, and BLX are switched, and the states of the signal lines STB, XXL, BLC, HLL, and BLX are (L, L, H, H, H). Along with this, the bit line BL_A and the sense node SEN shown in FIG. 5 are charged.

At a timing t202, the states of the signal lines XXL and HLL are switched, and the states of the signal lines STB, XXL, BLC, HLL, and BLX are (L, H, H, L, H). Along with this, the discharge of the sense node SEN is started.

At a timing t203, the state of the signal line XXL is switched, and the states of the signal lines STB, XXL, BLC, HLL, and BLX are (L, L, H, L, H). Along with this, the discharge of the sense node SEN ends.

At a timing t204, the state of the signal line STB is switched, and the states of the signal lines STB, XXL, BLC, HLL, and BLX are (H, L, H, L, H). Here, the sense transistor 31 is in an ON state or an OFF state according to the voltage of the sense node SEN. Therefore, when the signal line STB is switched to the "H" state, the charge of the wiring LBUS is discharged or maintained according to the voltage of the sense node SEN. One of the latch circuits in the sense amplifier module SAM acquires this state.

At a timing t205, the states of the signal lines STB and HLL are switched, and the states of the signal lines STB, XXL, BLC, HLL, and BLX are (L, L, H, H, H). Along with this, the discharge of the wiring LBUS ends. In addition, the charge of the sense node SEN is started.

In addition, at the timing t205, the state of the latch circuit SDL corresponding to the memory cell MC_B is inverted, and states of the latch circuit SDL corresponding to the memory cells MC_A, MC_B, and MC_C are (H, H, L). Along with this, the bit line BL_B is charged.

At a timing t206, the states of the signal lines XXL and HLL are switched, and the states of the signal lines STB, XXL, BLC, HLL, and BLX are (L, H, H, L, H). Along with this, the discharge of the sense node SEN is started.

At a timing t207, the state of the signal line XXL is switched, and the states of the signal lines STB, XXL, BLC, HLL, and BLX are (L, L, H, L, H). Along with this, the discharge of the sense node SEN ends.

At a timing t208, the state of the signal line STB is switched, and the states of the signal lines STB, XXL, BLC, HLL, and BLX are (H, L, H, L, H). Along with this, the charge of the wiring LBUS is discharged or maintained. One of the latch circuits in the sense amplifier module SAM acquires this state.

At a timing t209, the states of the signal lines STB and HLL are switched, and the states of the signal lines STB, XXL, BLC, HLL, and BLX are (L, L, H, H, H). Along with this, the discharge of the wiring LBUS ends. In addition, the charge of the sense node SEN is started.

In addition, at the timing t209, the state of the latch circuit SDL corresponding to the memory cell MC_A is inverted, and the states of the latch circuit SDL corresponding to the memory cells MC_A, MC_B, and MC_C are (L, H, L). Along with this, the bit line BL_A is discharged.

At a timing t221, the voltage of the selected word line WL is switched from the verification voltage $V_{VFYA}$ to the verification voltage $V_{VFYB}$.

At a timing t222, the states of the signal lines XXL and HLL are switched, and the states of the signal lines STB, XXL, BLC, HLL, and BLX are (L, H, H, L, H). Along with this, the discharge of the sense node SEN is started.

At a timing t223, the state of the signal line XXL is switched, and the states of the signal lines STB, XXL, BLC, HLL, and BLX are (L, L, H, L, H). Along with this, the discharge of the sense node SEN ends.

At a timing t224, the state of the signal line STB is switched, and the states of the signal lines STB, XXL, BLC, HLL, and BLX are (H, L, H, L, H). Along with this, the charge of the wiring LBUS is discharged or maintained. One of the latch circuits in the sense amplifier module SAM acquires this state.

At a timing t225, the states of the signal lines STB and HLL are switched, and the states of the signal lines STB, XXL, BLC, HLL, and BLX are (L, L, H, H, H). Along with this, the discharge of the wiring LBUS ends. In addition, the charge of the sense node SEN is started.

In addition, at the timing t225, the state of the latch circuit SDL corresponding to the memory cell MC_C is inverted, and the states of the latch circuit SDL corresponding to the memory cells MC_A, MC_B, and MC_C are (L, H, H). Along with this, the bit line BL_C is charged.

At a timing t226, the states of the signal lines XXL and HLL are switched, and the states of the signal lines STB, XXL, BLC, HLL, and BLX are (L, H, H, L, H). Along with this, the discharge of the sense node SEN is started.

At a timing t227, the state of the signal line XXL is switched, and the states of the signal lines STB, XXL, BLC, HLL, and BLX are (L, L, H, L, H). Along with this, the discharge of the sense node SEN ends.

At a timing t228, the state of the signal line STB is switched, and the states of the signal lines STB, XXL, BLC, HLL, and BLX are (H, L, H, L, H). Along with this, the charge of the wiring LBUS is discharged or maintained. One of the latch circuits in the sense amplifier module SAM acquires this state.

At a timing t229, the states of the signal lines STB and HLL are switched, and the states of the signal lines STB, XXL, BLC, HLL, and BLX are (L, L, H, H, H). Along with this, the discharge of the wiring LBUS ends. In addition, the charge of the sense node SEN is started.

In addition, at the timing t229, the state of the latch circuit SDL corresponding to the memory cell MC_B is inverted, and the states of the latch circuit SDL corresponding to the memory cells MC_A, MC_B, MC_C are (L, L, H). Along with this, the bit line BL_B is discharged.

At a timing t241, the voltage of the selected word line WL is switched from the verification voltage $V_{VFYB}$ to the verification voltage $V_{VFYC}$.

At a timing t242, the states of the signal lines XXL and HLL are switched, and the states of the signal lines STB, XXL, BLC, HLL, and BLX are (L, H, H, L, H). Along with this, the discharge of the sense node SEN is started.

At a timing t243, the state of the signal line XXL is switched, and the states of the signal lines STB, XXL, BLC, HLL, and BLX are (L, L, H, L, H). Along with this, the discharge of the sense node SEN ends.

At a timing t244, the state of the signal line STB is switched, and the states of the signal lines STB, XXL, BLC, HLL, and BLX are (H, L, H, L, H). Along with this, the charge of the wiring LBUS is discharged or maintained. One of the latch circuits in the sense amplifier module SAM acquires this state.

At a timing t245, the states of the signal lines STB and HLL are switched, and the states of the signal lines STB, XXL, BLC, HLL, and BLX are (L, L, H, H, H). Along with this, the discharge of the wiring LBUS ends. In addition, the charge of the sense node SEN is started.

At a timing t246, the states of the signal lines XXL and HLL are switched, and the states of the signal lines STB, XXL, BLC, HLL, and BLX are (L, H, H, L, H). Along with this, the discharge of the sense node SEN is started.

At a timing t247, the state of the signal line XXL is switched, and the states of the signal lines STB, XXL, BLC, HLL, and BLX are (L, L, H, L, H). Along with this, the discharge of the sense node SEN ends.

At a timing t248, the state of the signal line STB is switched, and the states of the signal lines STB, XXL, BLC, HLL, and BLX are (H, L, H, L, H). Along with this, the charge of the wiring LBUS is discharged or maintained. One of the latch circuits in the sense amplifier module SAM acquires this state.

At a timing t249, the states of the signal lines STB and HLL are switched, and the states of the signal lines STB, XXL, BLC, HLL, and BLX are (L, L, H, H, H). Along with this, the discharge of the wiring LBUS ends. In addition, the charge of the sense node SEN is started.

In addition, at the timing t249, the state of the latch circuit SDL corresponding to the memory cell MC_C is inverted, and the states of the latch circuit SDL corresponding to the memory cells MC_A, MC_B, and MC_C are (L, L, L). Along with this, the bit line BL_C is discharged.

In the following description, a time $t_{S1}$ from the timing t202 to the timing t203, a time $t_{S1}$ from timing the t222 to the timing t223, and a time $t_{S1}$ from the timing t242 to the timing t243 may be referred to as a sense time $t_{S1}$. In addition, a time $t_{S2}$ from the timing t206 to the timing t207, a time $t_{S2}$ from the timing t226 to the timing t227, and a time $t_{S2}$ from the timing t246 to the timing t247 may be referred to as a sense time $t_{S2}$. The sense time $t_{S1}$ is shorter than the sense time $t_{S2}$.

In the example of FIG. 17, the state of the memory cell MC_A is acquired twice, and the states of the memory cells MC_B and MC_C are acquired three times.

Among the memory cell MC_A, a memory cell MC_A in which a sufficient current flows between the timing t202 and the timing t203 (i.e., a memory cell MC_A in which data of the corresponding latch circuits SDL, ADL, BDL, and CDL are inverted between the timing t204 and the timing t205) is classified as the memory cell MC_c. Among other memory cell MC_A, the memory cell MC_A in which a sufficient current flows between the timing t206 and the timing t207 is classified as the memory cell MC_b. Among still other memory cell MC_A, the memory cell MC_A in which a sufficient current does not flow between the timing t206 and the timing t207 is classified as the memory cell MC_a.

Among the memory cell MC_B, the memory cell MC_B in which a sufficient current flows between the timing t206 and the timing t207 is classified as the memory cell MC_d. Among other memory cell MC_B, the memory cell MC_B in which a sufficient current flows between the timing t222 and the timing t223 is classified as the memory cell MC_c.

Among still other memory cell MC_B, the memory cell MC_B in which a sufficient current flows between the timing t226 and the timing t227 is classified as the memory cell MC_b. Among yet other memory cells MC_B, the memory cell MC_B in which a sufficient current does not flow between the timing t226 and the timing t227 is classified as the memory cell MC_a.

Among the memory cell MC_C, the memory cell MC_C in which a sufficient current flows between the timing t226 and the timing t227 is classified as the memory cell MC_d. Among other memory cell MC_C, the memory cell MC_C in which a sufficient current flows between the timing t242 and the timing t243 is classified as the memory cell MC_c. Among still other memory cell MC_C, the memory cell MC_C in which a sufficient current flows between the timing t246 and the timing t247 is classified as the memory cell MC_b. Among yet other memory cell MC_C, the memory cell MC_C in which a sufficient current does not flow between the timing t246 and the timing t247 is classified as the memory cell MC_a.

[Effect]

According to the semiconductor storage device of the present embodiment, by sequentially switching the channel-gate voltage of the memory cell MC according to the threshold voltage of the memory cell MC, the amount of electrons accumulated in the charge storage film 132 of each memory cell MC is controlled in a plurality of stages. Accordingly, a width of the threshold voltage distribution as described with reference to FIG. 10A can be narrowed, and the number of error bits can be reduced.

For example, when the amount of electrons accumulated in the charge storage film 132 of the memory cell MC is controlled in a plurality of stages, it can be considered that the bit line BL can be connected to a plurality of voltage supply lines. However, when such a configuration is to be implemented, the number of transistors in the sense amplifier SA increases. Here, since the number of sense amplifiers SAs is same as the number of bit lines BLs, when the number of transistors of the sense amplifier SA increases, a circuit area may increase greatly. Therefore, according to the semiconductor storage device of the present embodiment, the voltage of the bit line BL is sequentially switched at a plurality of timings. Such a method can be implemented without increasing the number of transistors in the sense amplifier SA.

Other Embodiments

The semiconductor storage device according to the first embodiment is described above. However, the above description is merely an example, and the above-described configuration and method may be adjusted as appropriate.

For example, in the program operation shown in FIG. 16, the timing t105 at which the voltage of the bit line BL_b rises is after the timing t104 at which the program voltage $V_{PGM}$ is supplied to the selected word line WL. However, if the timing at which the voltage of the bit line BL_b rises is after the timing t102 at which the ON voltage $V_{ON}'$ is supplied to the drain select line SGD corresponding to the selected page P, the timing may be before the timing t104 at which the program voltage $V_{PGM}$ is supplied to the selected word line WL.

For another example, in the example of FIG. 16, the selected memory cell MC is classified into one of four memory cells MC_a, MC_b, MC_c, and MC_d, and voltage control is performed in four types of modes. However, the selected memory cell MC may be classified into five or more types, and the voltage control may be performed in five or more modes.

In such a case, for example, in the program operation, it can be considered to invert data in the latch circuit SDL connected to the memory cells MC corresponding to the fifth and subsequent classifications at a predetermined timing from the timing t103 to the timing t107 in FIG. 16. However, it can be considered that this timing is different from the timing t105 and the timing t106.

In addition, in the verification operation shown in FIG. 17, each time the verification voltage supplied to the selected word line WL is switched, the state of the memory cell MC is acquired twice using two types of sense times $t_{S1}$ and $t_{S2}$. However, the state of the memory cell MC may be acquired three times using three or more types of sense times after the verification voltage is switched. In addition, the state of the memory cell MC may also be acquired once after the verification voltage is switched.

Further, in the verification operation shown in FIG. 17, a voltage of the bit line BL_B corresponding to the B state rises while the verification voltage $V_{VFYA}$ corresponding to the A state is supplied to the selected word line WL, and between the timing t206 and the timing t209, the states of both the memory cell MC_A corresponding to the A state and the memory cell MC_B corresponding to the B state are acquired. However, the timing at which the voltage of each bit line BL rises may be earlier or later.

Furthermore, in the verification operation shown in FIG. 17, any one of seven types of verification voltages $V_{VFYA}$ to $V_{VFYG}$ corresponding to the A state to the G state is used. However, for example, two or more types of verification voltages may be set corresponding to each state.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
   a plurality of memory transistors including first, second, and third memory transistors;
   a plurality of bit lines including first, second, and third bit lines electrically connected to the first, second, and third memory transistors, respectively;
   a word line electrically connected to the first, second, and third memory transistors; and
   a control circuit configured to perform a program operation to write data to the plurality of memory transistors,
   wherein the program operation for writing data to the second and third memory transistors includes
      raising a first voltage applied to the first bit line at a first timing,
      raising a second voltage applied to the word line at a second timing after the first timing,
      raising a third voltage applied to the second bit line at a third timing after the second timing,
      raising a fourth voltage applied to the third bit line at a fourth timing after the third timing, and lowering the first voltage at a fifth timing after the fourth timing, and the first voltage is raised to a first predetermined voltage, and each of the third and fourth voltages is raised to a second predetermined voltage that is smaller than the first predetermined voltage.

2. The semiconductor storage device according to claim 1, wherein
the first predetermined voltage is a program inhibit voltage at which write to the first memory transistor is inhibited.

3. The semiconductor storage device according to claim 1, further comprising:
a power supply electrode by which a power supply voltage is applied to the control circuit,
wherein a current flowing through the power supply electrode rises at the third timing and falls before the fourth timing.

4. The semiconductor storage device according to claim 3, wherein:
the current flowing through the power supply electrode further rises at the fourth timing and falls before the fifth timing.

5. The semiconductor storage device according to claim 1, wherein
the control circuit includes:
a plurality of transistors including first, second, and third transistors electrically connected to the first, second, and third bit lines, and
a plurality of latch circuits including first, second, and third latch circuits electrically connected to gate electrodes of the first, second, and third transistors, respectively, and
the program operation for writing data to the second and third memory transistors includes
raising or lowering a voltage applied to the first latch circuit at the first timing,
raising or lowering a voltage applied to the second latch circuit at the third timing, and
raising or lowering a voltage applied to the third latch circuit at the fourth timing.

6. The semiconductor storage device according to claim 5, wherein
at the first timing, the first latch circuit is set to a first state, and the second and third latch circuits are set to a second state,
at the third timing, the first and second latch circuits are set to the first state, and the third latch circuit is set to the second state, and
at the fourth timing, the first, second, and third latch circuits are set to the first state.

7. The semiconductor storage device according to claim 1, wherein
the second voltage is raised to a third predetermined voltage after the first timing.

8. The semiconductor storage device according to claim 7, wherein
the second voltage is raised to a fourth predetermined voltage higher than the third predetermined voltage between the second and third timings.

9. The semiconductor storage device according to claim 1, wherein
the semiconductor storage device is a memory die including the control circuit and a memory cell array on which the memory transistors, the bit lines, and the word line are arranged.

10. The semiconductor storage device according to claim 9, wherein
the control circuit includes a sense amplifier circuit connected to the bit lines and a row decoder circuit connected to the word line.

11. A method for a semiconductor storage device to write data to a plurality of memory transistors including first, second, and third memory transistors that are connected to a word line and are respectively connected to first, second, and third bit lines, the method comprising:
when writing data to the second and third memory transistors, performing a program operation including:
raising a first voltage applied to the first bit line at a first timing;
raising a second voltage applied to the word line at a second timing after the first timing;
raising a third voltage applied to the second bit line at a third timing after the second timing;
raising a fourth voltage applied to the third bit line at a fourth timing after the third timing; and
lowering the first voltage at a fifth timing after the fourth timing,
wherein the first voltage is raised to a first predetermined voltage, and each of the third and fourth voltages is raised to a second predetermined voltage that is smaller than the first predetermined voltage.

12. The method according to claim 11, wherein
the first predetermined voltage is a program inhibit voltage at which write to the first memory transistor is inhibited.

13. The method according to claim 11, further comprising:
applying a power supply voltage to a control circuit of the semiconductor storage device via a power supply electrode such that a current flowing therethrough rises at the third timing and falls before the fourth timing.

14. The method according to claim 13, wherein:
the current flowing through the power supply electrode further rises at the fourth timing and falls before the fifth timing.

15. The method according to claim 11, wherein
the program operation is performed by a control circuit of the semiconductor storage device, including:
a plurality of transistors including first, second, and third transistors electrically connected to the first, second, and third bit lines, and
a plurality of latch circuits including first, second, and third latch circuits electrically connected to gate electrodes of the first, second, and third transistors, respectively, and
the program operation for writing data to the second and third memory transistors includes
raising or lowering a voltage applied to the first latch circuit at the first timing,
raising or lowering a voltage applied to the second latch circuit at the third timing, and
raising or lowering a voltage applied to the third latch circuit at the fourth timing.

16. The method according to claim 15, wherein
at the first timing, the first latch circuit is set to a first state, and the second and third latch circuits are set to a second state,
at the third timing, the first and second latch circuits are set to the first state, and the third latch circuit is set to the second state, and
at the fourth timing, the first, second, and third latch circuits are set to the first state.

17. The method according to claim 11, wherein
the second voltage is raised to a third predetermined voltage after the first timing.
18. The method according to claim 17, wherein
the second voltage is raised to a fourth predetermined voltage higher than the third predetermined voltage between the second and third timings.
19. The method according to claim 11, wherein
the semiconductor storage device is a memory die including the control circuit and a memory cell array on which the memory strings, the bit lines, and the word line are arranged.
20. The method according to claim 19, wherein
the program operation is performed by the control circuit including a sense amplifier circuit connected to the bit lines and a row decoder circuit connected to the word line.

* * * * *